(12) United States Patent
Mehandru et al.

(10) Patent No.: US 11,824,107 B2
(45) Date of Patent: Nov. 21, 2023

(54) WRAP-AROUND CONTACT STRUCTURES FOR SEMICONDUCTOR NANOWIRES AND NANORIBBONS

(71) Applicant: Intel Corporation, Santa Clara, CA (US)

(72) Inventors: Rishabh Mehandru, Portland, OR (US); Tahir Ghani, Portland, OR (US); Stephen Cea, Hillsboro, OR (US); Biswajeet Guha, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/984,170

(22) Filed: Nov. 9, 2022

(65) Prior Publication Data

US 2023/0068314 A1 Mar. 2, 2023

Related U.S. Application Data

(63) Continuation of application No. 16/238,978, filed on Jan. 3, 2019, now Pat. No. 11,527,640.

(51) Int. Cl.
*H01L 29/775* (2006.01)
*H01L 29/417* (2006.01)
(Continued)

(52) U.S. Cl.
CPC ...... *H01L 29/775* (2013.01); *H01L 29/41733* (2013.01); *H01L 29/42392* (2013.01); *H01L 29/66439* (2013.01); *H01L 29/78696* (2013.01)

(58) Field of Classification Search
CPC ............. H01L 29/775; H01L 29/41733; H01L 29/42392; H01L 29/66439;
(Continued)

(56) References Cited

U.S. PATENT DOCUMENTS 9,601,586 B1 * 3/2017 Kittl ............... H01L 21/823418
2011/0193141 A1   8/2011 Lin
(Continued)

OTHER PUBLICATIONS

Search Report from European Patent Application No. 19198879.9, dated Mar. 23, 2020, 9 pgs.
(Continued)

*Primary Examiner* — Jonathan Han
(74) *Attorney, Agent, or Firm* — Schwabe, Williamson & Wyatt, P.C.

(57) ABSTRACT

Wrap-around contact structures for semiconductor nanowires and nanoribbons, and methods of fabricating wrap-around contact structures for semiconductor nanowires and nanoribbons, are described. In an example, an integrated circuit structure includes a semiconductor nanowire above a first portion of a semiconductor sub-fin. A gate structure surrounds a channel portion of the semiconductor nanowire. A source or drain region is at a first side of the gate structure, the source or drain region including an epitaxial structure on a second portion of the semiconductor sub-fin, the epitaxial structure having substantially vertical sidewalls in alignment with the second portion of the semiconductor sub-fin. A conductive contact structure is along sidewalls of the second portion of the semiconductor sub-fin and along the substantially vertical sidewalls of the epitaxial structure.

20 Claims, 20 Drawing Sheets

(51) Int. Cl.
*H01L 29/423* (2006.01)
*H01L 29/66* (2006.01)
*H01L 29/786* (2006.01)

(58) Field of Classification Search
CPC ......... H01L 29/78696; H01L 21/76897; H01L
29/0673; H01L 29/0692; H01L 29/0847;
H01L 29/1079; H01L 29/41725; H01L
29/41791; H01L 29/785; H01L 29/401;
H01L 29/0669; H01L 29/66484; H01L
29/66795; H01L 29/7831; B82Y 10/00;
B82Y 40/00
See application file for complete search history.

(56) References Cited

U.S. PATENT DOCUMENTS

| | | | |
|---|---|---|---|
| 2014/0001520 A1* | 1/2014 | Glass | H01L 29/167 |
| | | | 257/E21.409 |
| 2014/0110755 A1 | 4/2014 | Colinge | |
| 2014/0203370 A1 | 7/2014 | Maeda | |
| 2015/0255604 A1* | 9/2015 | Yang | H01L 21/26533 |
| | | | 257/192 |
| 2016/0148936 A1 | 5/2016 | Xu | |
| 2018/0315833 A1 | 11/2018 | Duriez | |
| 2018/0374791 A1 | 12/2018 | Smith | |

OTHER PUBLICATIONS

Office Action from European Patent Application No. 19198879.9, dated Jan. 5, 2022, 6 pgs.

* cited by examiner

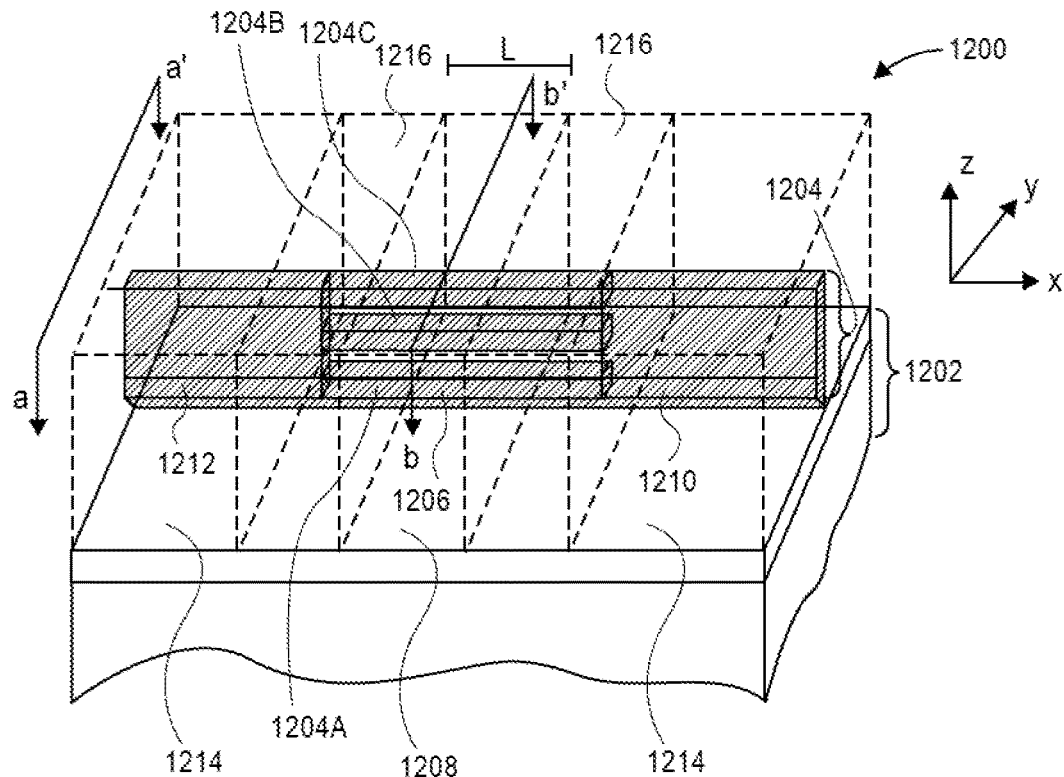
FIG. 12A
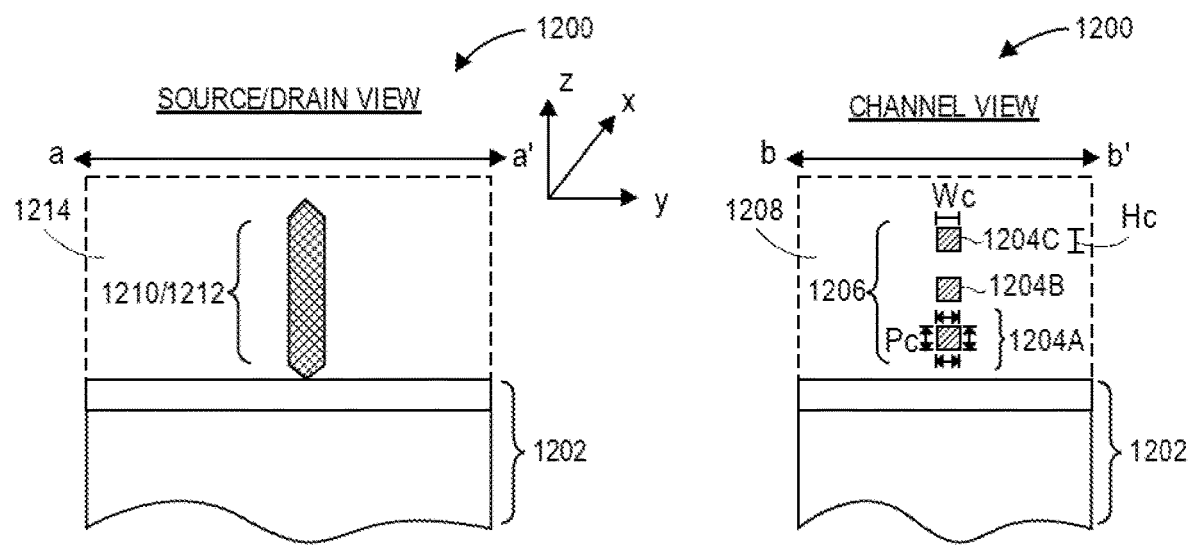
FIG. 12B  FIG. 12C

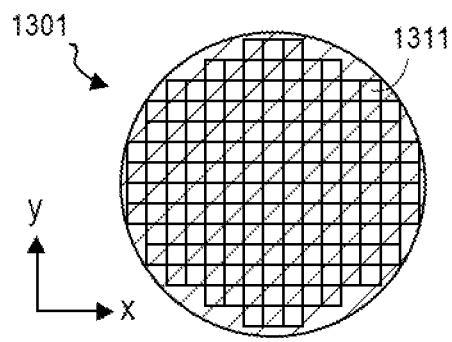
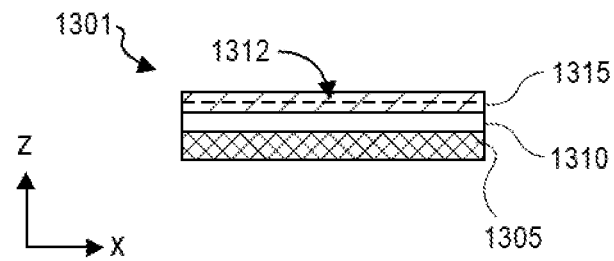
FIG. 13A  FIG. 14A
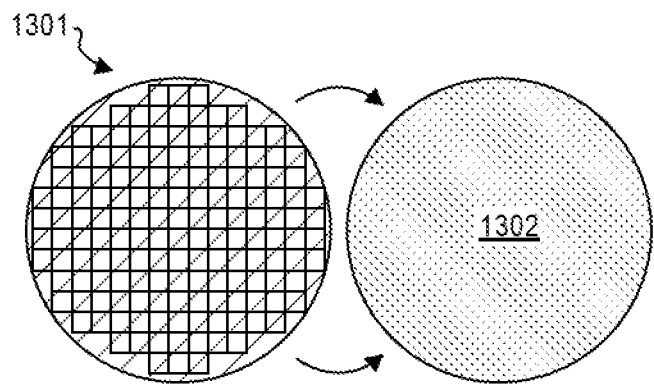
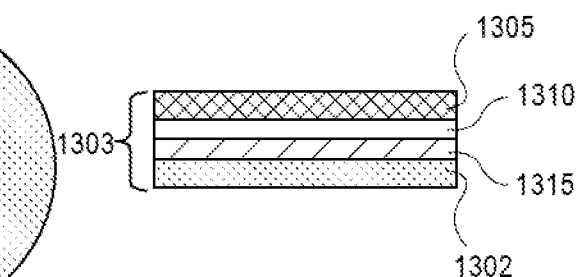
FIG. 13B  FIG. 14B
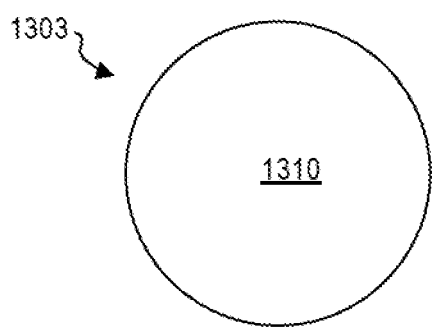
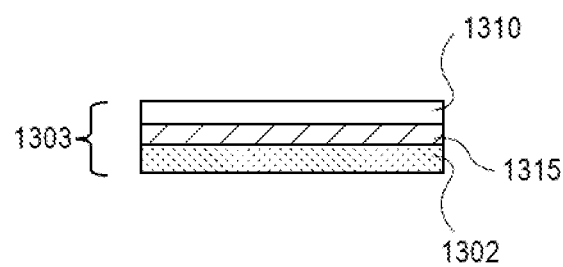
FIG. 13C  FIG. 14C

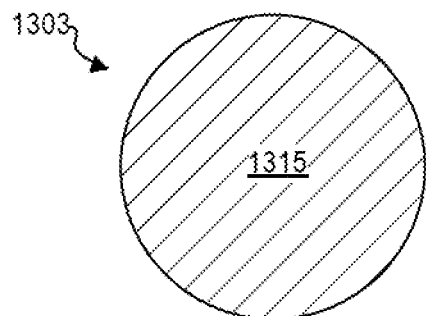 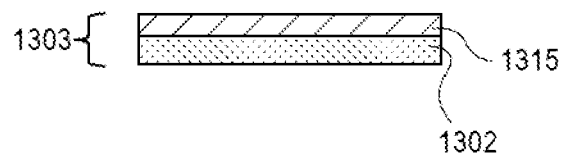
FIG. 13D             FIG. 14D
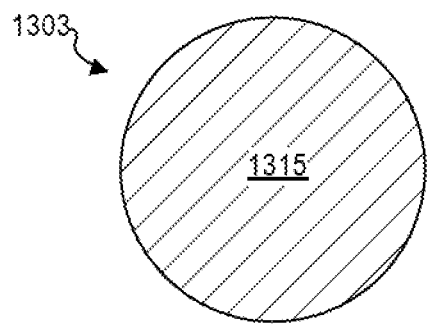 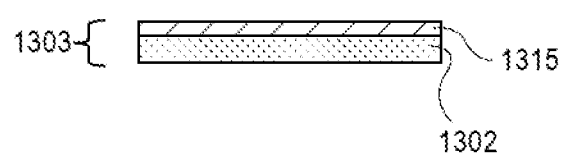
FIG. 13E             FIG. 14E
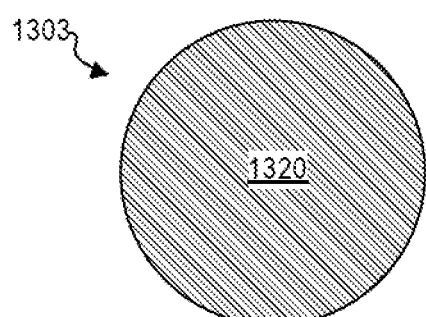 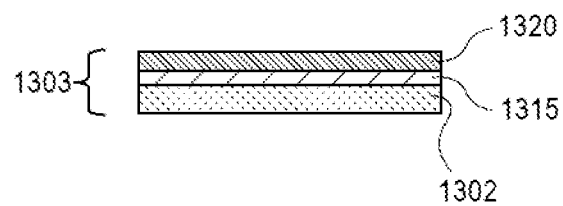
FIG. 13F             FIG. 14F

WRAP-AROUND CONTACT STRUCTURES FOR SEMICONDUCTOR NANOWIRES AND NANORIBBONS

CROSS-REFERENCE TO RELATED APPLICATIONS

This application is a continuation of U.S. patent application Ser. No. 16/238,978, filed on Jan. 3, 2019, the entire contents of which is hereby incorporated by reference herein.

TECHNICAL FIELD

Embodiments of the disclosure are in the field of integrated circuit structures and processing and, in particular, wrap-around contact structures for semiconductor nanowires and nanoribbons, and methods of fabricating wrap-around contact structures for semiconductor nanowires and nanoribbons.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In another aspect, maintaining mobility improvement and short channel control as microelectronic device dimensions scale below the 10 nanometer (nm) node provides a challenge in device fabrication. Nanowires used to fabricate devices provide improved short channel control.

Scaling multi-gate and nanowire transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

Device density in integrated circuits (ICs) has increased for decades in conformance with Moore's law. However, as the lateral dimensions of a device structure shrink with each technology generation, it becomes increasingly difficult to further reduce structural dimensions. Three-dimensional (3D) scaling is now of considerable interest as reductions in z-height (device thickness) offer another avenue of increasing overall device density and IC performance. 3D scaling may be in the form of chip stacking or packaged IC stacking, for example. Known 3D integration techniques are expensive and may offer only incremental improvements in z-height and device density. For example, the majority of the thickness of a chip may be inactive substrate material. A stack of such chips may employ through-substrate via (TSV) technology as a means of vertically interconnecting the chip stack. A TSV typically extends through 20-50 µm, or more, of substrate material and therefore is generally limited to via diameters on the micron-scale. As such, TSV density is limited to far below the density of most device (e.g., transistor, memory) cells. Also, the final z-height of a chip-stack employing TSV technology may be hundreds of microns thicker than the actual device layers employed by the stacked device.

3D scaling may also be in the form of vertically-oriented devices, for example where a transistor channel length is substantially normal to a surface of a substrate rather than parallel to that surface for the more common laterally-oriented transistor. One problem faced by many vertically-oriented device architectures is how to fabricate terminals on opposite ends of the device, which is more readily done for laterally-oriented devices.

BRIEF DESCRIPTION OF THE DRAWINGS

FIG. 12A illustrates a three-dimensional cross-sectional view of a nanowire-based integrated circuit structure, in accordance with an embodiment of the present disclosure.

FIG. 12B illustrates a cross-sectional source or drain view of the nanowire-based integrated circuit structure of FIG. 12A, as taken along the a-a' axis, in accordance with an embodiment of the present disclosure.

FIG. 12C illustrates a cross-sectional channel view of the nanowire-based integrated circuit structure of FIG. 12A, as taken along the b-b' axis, in accordance with an embodiment of the present disclosure.

FIGS. 13A-13H illustrate plan views of a substrate processed with double-sided device processing methods, in accordance with some embodiments.

FIGS. 14A-14H illustrate cross-sectional views of a substrate processed with double-sided device processing methods, in accordance with some embodiments.

DESCRIPTION OF THE EMBODIMENTS

Figure 1:
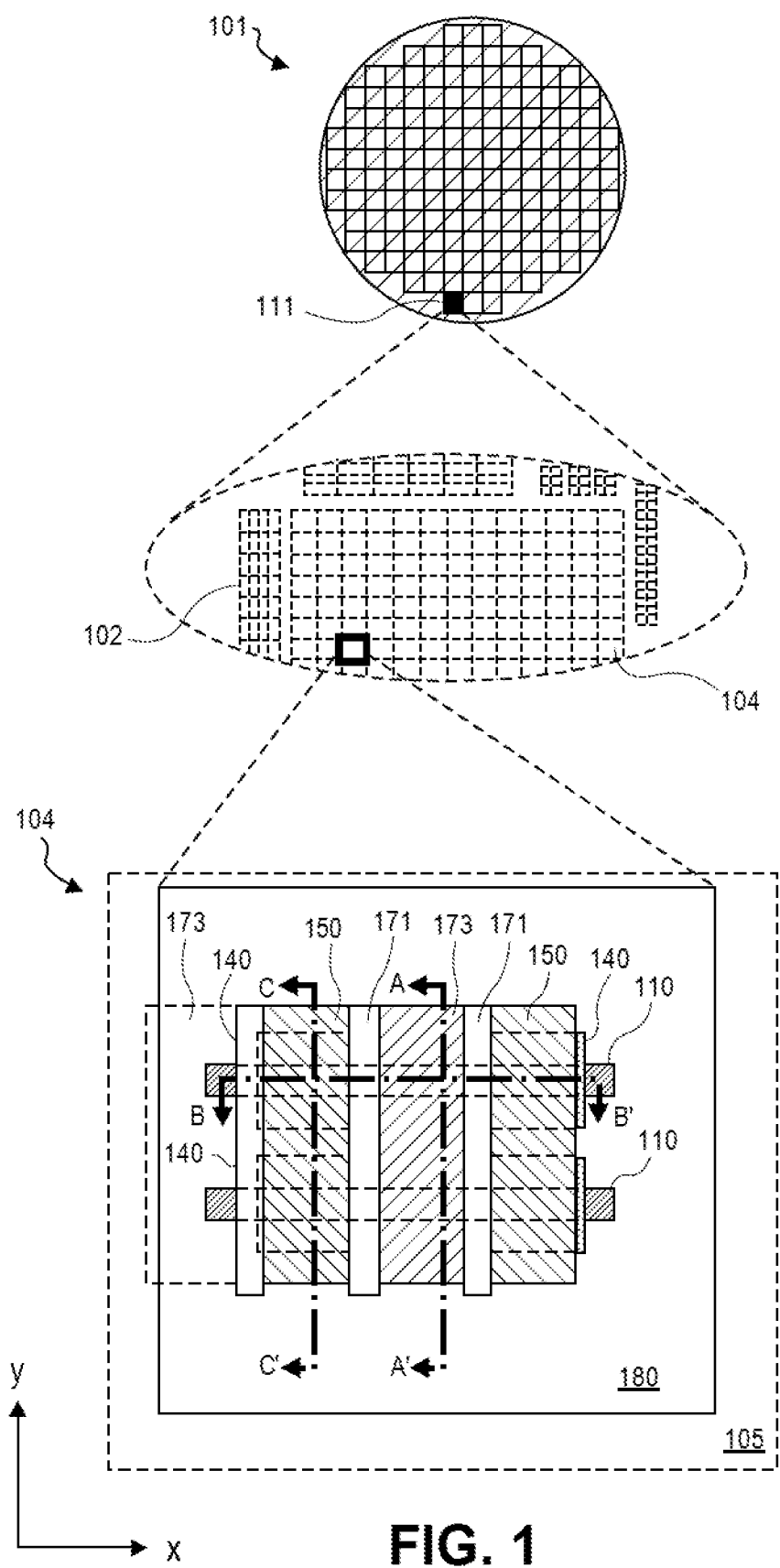
FIG. 1 is a plan view of a substrate with expanded views of IC die on the substrate, and of a transistor cell on the IC die, in accordance with some embodiments.

Wrap-around contact structures for semiconductor nanowires and nanoribbons, and methods of fabricating wrap-around contact structures for semiconductor nanowires and nanoribbons, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments of the present disclosure are directed to integrated circuit structures or devices including wrap-around contacts utilizing self-aligned nanowire or nanoribbon fabrication approaches. It is to be appreciated that at scaled dimensions there may not be sufficient contact area for a device to exhibit low contact resistance (low Rext). Embodiments disclosed herein may be implemented to allow for improvement in performance limiting external resistance from contacts by enhancing contact area through a self-aligned approach which preserves high doping in epitaxial S/D region while allowing for contact resistance to be significantly reduced. Additionally, by providing metal directly in line with nanowires and nanoribbons further away from the top of a nanowire or nanoribbon stack, spreading may be significantly reduced. Embodiments may be implemented to provide a wrap-around contact structure for a source region, for a drain region, or for both a source region and a drain region.

To provide context, previous attempts to fabricate wrap-around contacts have resulted in significant loss of epitaxial source or drain material, resulting in meager improvement overall. Problems may lie with selectivity between etching a nitride etch stop layer and etching silicon may not be sufficient to prevent etch out of epitaxial source or drain material. Furthermore, if epitaxial material between two nanowires is merged, achieving total wrap around by a conductive contact structure in this way is not possible. Additionally, contact area reduces since ribbon/wire area is the available area for contact in such cases.

In accordance with one or more embodiments of the present disclosure, a self-aligned contact etch process is performed after a nanowire or nanoribbon substrate is removed by polishing, etch etc. A self-aligned mask is formed on the nanowires/nanoribbons after the wafer is inverted and etched/polished to expose a sub-fin region. The mask is used to preserve fin material while portions of epitaxal source or drain extensions extensions which protrude away from the nanowires/nanoribbons are etched away. Following the etch process, a contact metal with low Schottky barrier height may be deposited conformally to form a wrap-around contact. Such a wrap-around contact may exhibit between 1.5×-6× contact resistance reduction. Additionally, embodiments described herein may be implemented to allow for significantly improved (lowered) bulk spreading resistance. With improved contact resistance, integrated circuit structures may exhibit higher performance at matched power by reducing active channel width for a comparable device, or by reducing power consumption at matched leakage.

Integrated circuit structures described herein may be fabricated using a back-side reveal of front-side structures fabrication approach. In some exemplary embodiments, reveal of the back-side of a transistor or other device structure entails wafer-level back-side processing. In contrast to a conventional TSV-type technology, a reveal of the back-side of a transistor as described herein may be performed at the density of the device cells, and even within sub-regions of a device. Furthermore, such a reveal of the back-side of a transistor may be performed to remove substantially all of a donor substrate upon which a device layer was disposed during front-side device processing. As such, a microns-deep TSV becomes unnecessary with the thickness of semiconductor in the device cells following a reveal of the back-side of a transistor potentially being only tens or hundreds of nanometers.

Reveal techniques described herein may enable a paradigm shift from "bottom-up" device fabrication to "center-out" fabrication, where the "center" is any layer that is employed in front-side fabrication, revealed from the back side, and again employed in back-side fabrication. Processing of both a front side and revealed back side of a device structure may address many of the challenges associated with fabricating 3D ICs when primarily relying on front-side processing.

A reveal of the back-side of a transistor approach may be employed for example to remove at least a portion of a carrier layer and intervening layer of a donor-host substrate assembly, for example as illustrated in FIGS. 13A-13H and 14A-14H, described below. The process flow begins with an input of a donor-host substrate assembly. A thickness of a carrier layer in the donor-host substrate is polished (e.g., CMP) and/or etched with a wet or dry (e.g., plasma) etch process. Any grind, polish, and/or wet/dry etch process known to be suitable for the composition of the carrier layer may be employed. For example, where the carrier layer is a group IV semiconductor (e.g., silicon) a CMP slurry known to be suitable for thinning the semiconductor may be employed. Likewise, any wet etchant or plasma etch process known to be suitable for thinning the group IV semiconductor may also be employed.

In some embodiments, the above is preceded by cleaving the carrier layer along a fracture plane substantially parallel to the intervening layer. The cleaving or fracture process may be utilized to remove a substantial portion of the carrier layer as a bulk mass, reducing the polish or etch time needed to remove the carrier layer. For example, where a carrier layer is 400-900 μm in thickness, 100-700 μm may be cleaved off by practicing any blanket implant known to promote a wafer-level fracture. In some exemplary embodiments, a light element (e.g., H, He, or Li) is implanted to a uniform target depth within the carrier layer where the fracture plane is desired. Following such a cleaving process, the thickness of the carrier layer remaining in the donor-host substrate assembly may then be polished or etched to complete removal. Alternatively, where the carrier layer is not fractured, the grind, polish and/or etch operation may be employed to remove a greater thickness of the carrier layer.

Next, exposure of an intervening layer is detected. Detection is used to identify a point when the back-side surface of the donor substrate has advanced to nearly the device layer. Any endpoint detection technique known to be suitable for detecting a transition between the materials employed for the carrier layer and the intervening layer may be practiced.

In some embodiments, one or more endpoint criteria are based on detecting a change in optical absorbance or emission of the back-side surface of the donor substrate during the polishing or etching performed. In some other embodiments, the endpoint criteria are associated with a change in optical absorbance or emission of byproducts during the polishing or etching of the donor substrate back-side surface. For example, absorbance or emission wavelengths associated with the carrier layer etch byproducts may change as a function of the different compositions of the carrier layer and intervening layer. In other embodiments, the endpoint criteria are associated with a change in mass of species in byproducts of polishing or etching the back-side surface of the donor substrate. For example, the byproducts of processing may be sampled through a quadrupole mass analyzer and a change in the species mass may be correlated to the different compositions of the carrier layer and intervening layer. In another exemplary embodiment, the endpoint criteria is associated with a change in friction between a back-side surface of the donor substrate and a polishing surface in contact with the back-side surface of the donor substrate.

Detection of the intervening layer may be enhanced where the removal process is selective to the carrier layer relative to the intervening layer as non-uniformity in the carrier removal process may be mitigated by an etch rate delta between the carrier layer and intervening layer. Detection may even be skipped if the grind, polish and/or etch operation removes the intervening layer at a rate sufficiently below the rate at which the carrier layer is removed. If an endpoint criteria is not employed, a grind, polish and/or etch operation of a predetermined fixed duration may stop on the intervening layer material if the thickness of the intervening layer is sufficient for the selectivity of the etch. In some examples, the carrier etch rate: intervening layer etch rate is 3:1-10:1, or more.

Upon exposing the intervening layer, at least a portion of the intervening layer may be removed. For example, one or more component layers of the intervening layer may be removed. A thickness of the intervening layer may be removed uniformly by a polish, for example. Alternatively, a thickness of the intervening layer may be removed with a masked or blanket etch process. The process may employ the same polish or etch process as that employed to thin the carrier, or may be a distinct process with distinct process parameters. For example, where the intervening layer provides an etch stop for the carrier removal process, the latter operation may employ a different polish or etch process that favors removal of the intervening layer over removal of the device layer. Where less than a few hundred nanometers of intervening layer thickness is to be removed, the removal process may be relatively slow, optimized for across-wafer uniformity, and more precisely controlled than that employed for removal of the carrier layer. A CMP process employed may, for example employ a slurry that offers very high selectively (e.g., 100:1-300:1, or more) between semiconductor (e.g., silicon) and dielectric material (e.g., SiO) surrounding the device layer and embedded within the intervening layer, for example, as electrical isolation between adjacent device regions.

For embodiments where the device layer is revealed through complete removal of the intervening layer, backside processing may commence on an exposed backside of the device layer or specific device regions there in. In some embodiments, the backside device layer processing includes a further polish or wet/dry etch through a thickness of the device layer disposed between the intervening layer and a device region previously fabricated in the device layer, such as a source or drain region.

In some embodiments where the carrier layer, intervening layer, or device layer backside is recessed with a wet and/or plasma etch, such an etch may be a patterned etch or a materially selective etch that imparts significant non-planarity or topography into the device layer back-side surface. As described further below, the patterning may be within a device cell (i.e., "intra-cell" patterning) or may be across device cells (i.e., "inter-cell" patterning). In some patterned etch embodiments, at least a partial thickness of the intervening layer is employed as a hard mask for back-side device layer patterning. Hence, a masked etch process may preface a correspondingly masked device layer etch.

The above described processing scheme may result in a donor-host substrate assembly that includes IC devices that have a back side of an intervening layer, a back side of the device layer, and/or back side of one or more semiconductor regions within the device layer, and/or front-side metallization revealed. Additional backside processing of any of these revealed regions may then be performed during downstream processing.

FIG. 1 is a plan view of a donor substrate 101 with an expanded view of an IC die 111, and of a further expanded view of a logic transistor cell 104 disposed within IC die 111, in accordance with some embodiments. In further reference to FIG. 1, a plurality of logic transistor cells 104 is arrayed over an area of a device layer within IC die 111. Additional device cells 102 may be, for example, any of memory cells, power transistor cells, RF transistor cells, optical device cells, or the like. Transistor cell 104 includes a field effect FET with a source terminal, a drain terminal, and a gate terminal, in accordance with some illustrative embodiments. In some embodiments, the source or drain terminals include semiconductor having the same conductivity type. In other embodiments, the source or drain terminals include semiconductor having complementary conductivity type (i.e., a tunnel FET, or TFET). The FET may also include a heterojunction (i.e., HFET) and may also qualify as a high electron mobility transistor (HEMT) when the channel includes a III-V or III-N material. In FIG. 1, solid lines within transistor cell 104 denote salient materials formed in a front side a transistor cell stratum while dashed lines denote salient material interfaces within the transistor cell stratum that are disposed below another overlying material. Heavy dot-dashed lines in FIG. 1 denote planes A-A', B-B' and C-C' along which cross-sectional views are further provided as FIGS. 2A-2C, 3A-3C, 4A-4C and 5A-5C, where the letter in the figure number corresponds to the cross-sectional plane designated by that same letter.

As further shown in FIG. 1, FET cell 104 is supported by a back-side substrate 105 with semiconductor bodies 110 that are embedded within a front-side field isolation dielectric material 180. In some embodiments, back-side substrate 105 includes a carrier layer. In some embodiments, an intervening layer (not depicted) separates back-side substrate 105 from FET cell 104. In some other embodiments, back-side substrate 105 includes both a carrier layer and an intervening layer. In one example, FET cell 104 is fabricated on donor substrate 101.

In further reference to FIG. 1, transistor cell 104 includes a gate electrode 173 strapping across a channel region of each of a first and a second semiconductor body 110. Although two semiconductor bodies 110 are illustrated in FIG. 1, a non-planar FET may include one or more such semiconductor bodies. In some exemplary embodiments, semiconductor bodies 110 include at least one semiconductor nanowire or nanoribbon above donor substrate 101. For example, a transistor channel region within semiconductor bodies 110 may include a semiconductor nanowire or nanoribbon. Semiconductor bodies 110 may include one or more semiconductor regions having any of the compositions described below for a device layer that is suitable for a field effect transistor. Exemplary materials include, but are not limited to, group IV semiconductors (e.g., Si, Ge, SiGe), group III-V semiconductors (e.g., GaAs, InGaAs, InAs, InP), group III-N semiconductors (e.g., GaN, AlGaN, InGaN), oxide semiconductors, TMDCs, graphene, etc. In some advantageous embodiments, semiconductor bodies 110 are monocrystalline.

As further illustrated in FIG. 1, source or drain metallization 150 is disposed on opposite sides of gate electrode 173 and also extends across semiconductor bodies 110. In the illustrated embodiment, source or drain metallization 150 is disposed on regrown or raised source or drain semiconductor 140, which is further disposed in contact with semiconductor bodies 110. Source or drain semiconductor 140 may be doped with electrically active impurities imparting n-type or p-type conductivity. For some exemplary embodiments, both the source or drain semiconductor 140 is doped to the same conductivity type (e.g., n-type for NMOS and p-type for PMOS). In alternative embodiments (e.g., for a tunneling FET), source or drain semiconductor 140 are doped to have complementary conductivity (e.g., n-type source and p-type drain). Source or drain semiconductor 140 may be any semiconductor material compatible with semiconductor bodies 110, such as, but not limited to, group IV semiconductors (e.g., Si, Ge, SiGe), and/or group III-V semiconductors (e.g., InGaAs, InAs), and/or group III-N semiconductors (e.g., InGaN).

An electrically insulating spacer dielectric 171 laterally separates gate electrode 173 from source or drain metallization 150 and/or source or drain semiconductor 140. Source or drain metallization 150 may include one or more metals (e.g., Ti, W, Pt, their alloys, and nitrides) that form an ohmic or tunneling junction with doped source or drain semiconductor 140. Spacer dielectric 171 may be or any dielectric such as, but not limited to, silicon dioxide, silicon nitride, or silicon oxynitride, or any known low-k material having a relative permittivity below 4.0. Although only one gate electrode 173 is illustrated in solid line as being part of a single logic transistor cell, an exemplary second gate electrode 173 is drawn in dashed line as being associated with an adjacent cell. The second gate electrode is also laterally separated from metallization 150 and/or source or drain semiconductor 140 by spacer dielectric 171.

A reveal of the back-side of a transistor and isolation of transistors may enable formation of a transistor cell stratum that may be no more than a few hundred nanometers in thickness. As described elsewhere herein, such a stratum is amenable to being vertically stacked into a 3D IC having potentially very high vertical cell density (e.g., high strata count/micrometer thickness). Approaches described herein may also improve electrical isolation of transistors, for example by reducing through-substrate leakage between adjacent devices. A donor substrate including transistor cells employing a device layer of the donor substrate is used as a staring structure. The transistor cells may be completely operable as fabricated from the front side, for example including three terminals as illustrated in FIG. 1. Alternatively, one or more terminals may be absent such that the transistor cell will not be operable until back-side processing is complete. The donor substrate may have one or more of the features described above, such as, but not limited to, an intervening layer and a carrier layer. Notably however, a carrier layer and/or intervening layer may not be required. A donor-host substrate assembly may then be formed. The back side of the transistor cell is revealed by removing at least at portion of the donor substrate (e.g., carrier layer) to form a transistor stratum-host substrate assembly. As described below, contact structure engineering may then be performed. Isolation dielectric may then be deposited over the revealed backside surface, which in exemplary embodiments is a surface of a semiconductor or metal. The backside isolated transistor stratum-host substrate assembly may then undergo further processing.

FIGS. 2A, 3A, 4A, and 5A illustrate cross-sectional views of transistor cell 104 along the A-A' plane denoted in FIG. 1. FIGS. 2B, 3B, 4B and 5B illustrate cross-sectional views of transistor cell 104 along the B-B' plane denoted in FIG. 1. FIGS. 2C, 3C, 4C and 5C illustrate cross-sectional views of transistor cell 104 along the C-C' plane denoted in FIG. 1.

Figure 2A:
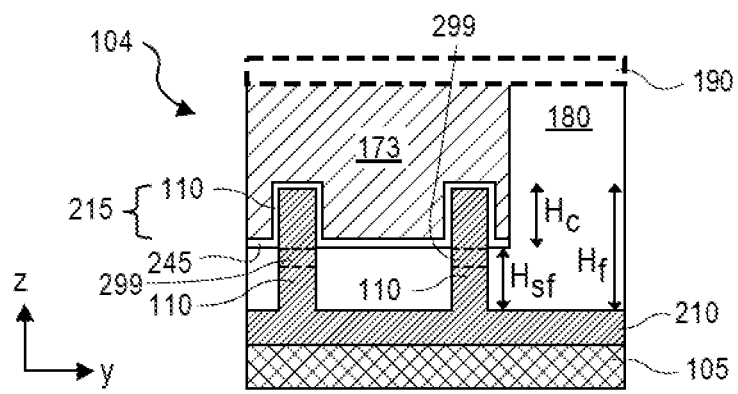
FIGS. 2A-2C illustrate cross-sectional views of a transistor cell as some operations in a method of fabricating wrap-around contact structures for semiconductor nanowires and nanoribbons are performed, in accordance with some embodiments.
Figure 2B:
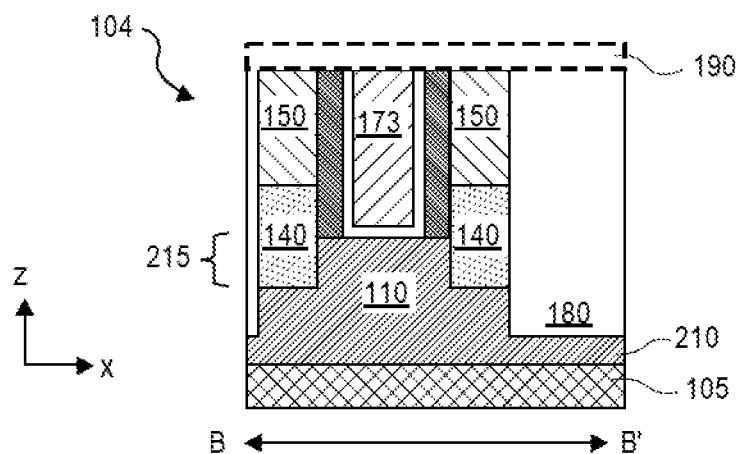
Figure 2C:
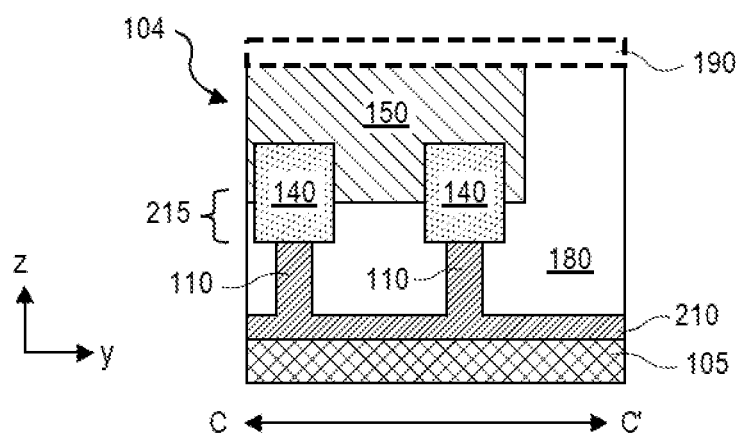

FIGS. 2A-2C illustrate cross-sectional views of a transistor cell as some operations in a method of fabricating wrap-around contact structures for semiconductor nanowires and nanoribbons are performed, in accordance with some embodiments.

Semiconductor bodies 110 are fin structures or "pseudo-fin" structures extending vertically (e.g., z-dimension) by a fin height $H_f$. In the case where nanowires or nanoribbons are used, a pseudo-fin structure includes a location 299 where a break in the fin structure separates a sub-fin portion from an overlying nanowire or nanoribbon. In such embodiments, a gate structure may be included in location 299 to provide a gate-all-around device or devices. Semiconductor bodies 110 include a channel portion having a channel height $H_c$. In some exemplary embodiments, channel height $H_c$ includes device layer 215. In the embodiments illustrated in FIGS. 2A-2C, semiconductor bodies 110 further include a sub-fin portion having a sub-fin height $H_{sf}$ that also includes device layer 215. Transistor semiconductor bodies 110 may have been formed, for example, with a patterned front-side recess etch of device layer 215. As described further elsewhere herein, semiconductor fin bodies may alternatively include a sub-fin semiconductor of a different composition than the channel portion, in which case the device layer 215 may only be the channel portion while the sub-fin semiconductor may be a component of an intervening layer 210. Alternatively, the sub-fin semiconductor may be considered a spacer between device layer 215 and back-side substrate 105, which may further include an intervening layer between the sub-fin semiconductor and a carrier layer. Surrounding one or more sidewalls of semiconductor bodies 110 is field isolation dielectric 180. Field isolation dielectric 180 may be one or more materials known to be suitable for providing electrical isolation between laterally (e.g., x or y dimension) adjacent transistors. In some exemplary embodiments, field isolation dielectric 180 includes silicon dioxide. Other materials, such as, but not limited to, SiN SiON, SiOC, polyimide, HSQ, or MSQ are also possible. In some embodiments field isolation dielectric 180 and the sub-fin portion of semiconductor bodies 110 make up the intervening layer upon which a carrier removal process is stopped.

An intersection of source or drain metallization with source or drain semiconductor 140 is further illustrated in FIG. 2A, while a gate stack including gate electrode 173 disposed over a gate dielectric 245 intersecting a channel portion of transistor semiconductor bodies 110 is further illustrated in FIGS. 2B and 2C. Semiconductor body channel portions are coupled to the gate stack and have a sidewall height $H_c$, below which is a sub-fin having a sub-fin z-height $H_{sf}$. While any gate stack materials known to be suitable for semiconductor bodies 110 may be utilized, in some exemplary embodiments the gate stack includes a high-k dielectric material (with a bulk relative permittivity greater than 9) and a metal gate electrode having a work function suitable for semiconductor bodies 110. Exemplary high-k materials include metal oxides, such as, but not limited to $Al_2O_3$, $HfO_2$, $HfAlO_x$. Silicates, such as, but not limited to $HfSiO_x$, or $TaSiO_x$ may also be suitable for some semiconductor body compositions (e.g., Si, Ge, SiGe, III-V). Gate electrode 173 may advantageously have a work function below 5 eV and may include an elemental metal layer, a metal alloy layer, or laminate structure of either or both. In some embodiments the gate electrode is a metal nitride, such as TiN (e.g., 4.0-4.7 eV). The gate electrode may also include Al (e.g., TiAlN). Other alloy constituents may also be employed in gate electrode 173, such as, but not limited to, C, Ta, W, Pt, and Sn.

FIGS. 2A-2C further illustrate a front-side stack 190 disposed over the front-side cell surface. Front-side stack 190 is illustrated in dashed line as being a portion of the transistor cell stratum that may vary without limitation and may, for example, include any number of backend interconnect metallization levels. Such levels may be separated from semiconductor bodies 110 and/or from each other by one or more inter-level dielectric (ILD) layer. Back-side substrate 105, which might further include an intervening layer and/or carrier layer, is disposed over the back-side cell surface.

Figure 3A:
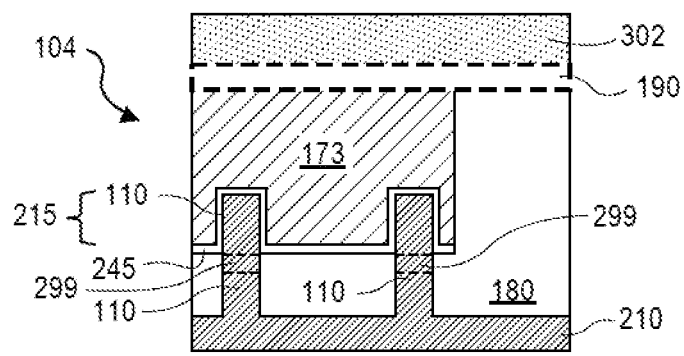
FIGS. 3A-3C illustrate cross-sectional views of a transistor cell as some operations in a method of fabricating wrap-around contact structures for semiconductor nanowires and nanoribbons are performed, in accordance with some embodiments.
Figure 3B:
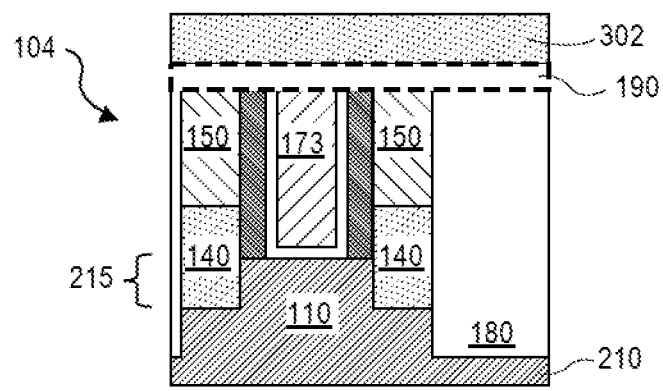
Figure 3C:
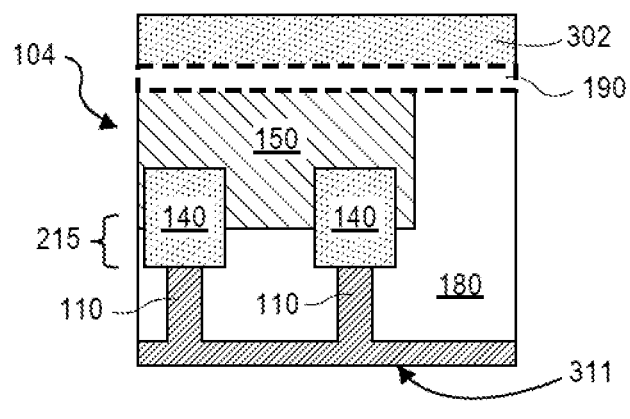

FIGS. 3A-3C depict transistor cell 104 following joining of the donor substrate to host substrate 302. Host substrate 302 may have any of the properties described elsewhere herein. As shown, host substrate 302 is joined to a front-side surface of front-side stack 190, for example by thermal-compression bonding. As further illustrated in FIGS. 3A-3C, back-side substrate 105 has been removed, exposing a back side surface 311 of intervening layer 210. Back-side substrate 105 may be removed by any technique, such as, but not limited to, approaches described above. A marker or etch stop, for example, may have been present within a first intervening layer 210 terminating the carrier removal operation prior to revealing the back side of field isolation 180.

Figure 4A:
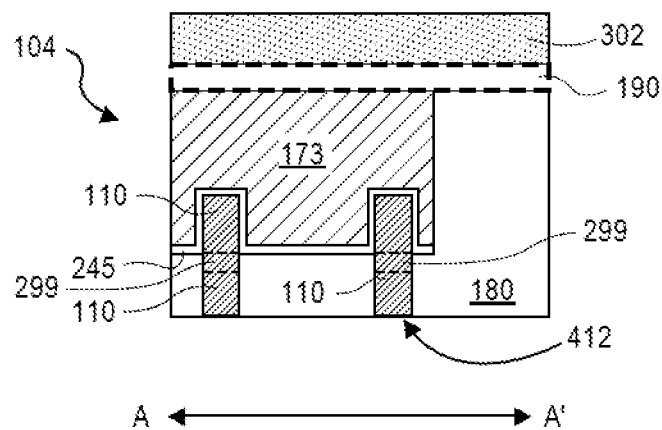
FIGS. 4A-4C illustrate cross-sectional views of a transistor cell as some operations in a method of fabricating wrap-around contact structures for semiconductor nanowires and nanoribbons are performed, in accordance with some embodiments.
Figure 4B:
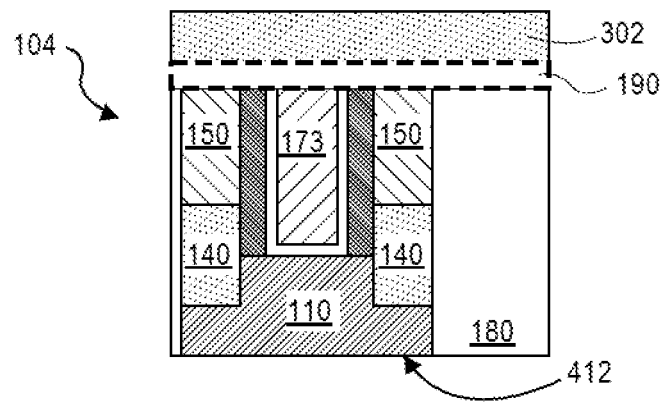
Figure 4C:
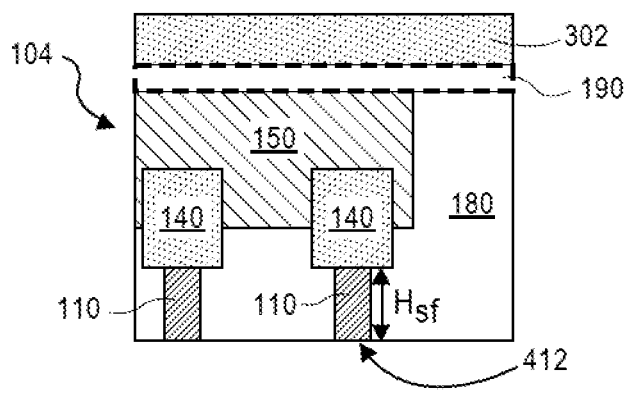

FIGS. 4A-4C depict transistor cell 104 following a reveal of a backside 412 of semiconductor bodies 110. To reveal the back side of transistor semiconductor bodies 110, portions of bulk semiconductor to which transistor semiconductor bodies 110 were anchored may be polished back and/or recess etched with a wet and/or dry etch process, for example as described above. In some exemplary embodiments where a highly selective (e.g., 200-300:1) CMP slurry having a higher etch rate of device layer semiconductor (e.g., Si) than dielectric is employed, the back-side polish of intervening layer 210 may be stopped upon exposure of field isolation dielectric 180. Any amount of over-etch (over-polish) may be performed to reduce sub-fin height $H_{sf}$ by further thinning the intervening layer including the sub-fin portion of semiconductor bodies 110 and adjacent field isolation dielectric 180. In some embodiments, the entire sub-fin for one or more semiconductor bodies within a transistor cell may be removed during the back-side reveal operation.

Figure 5A:
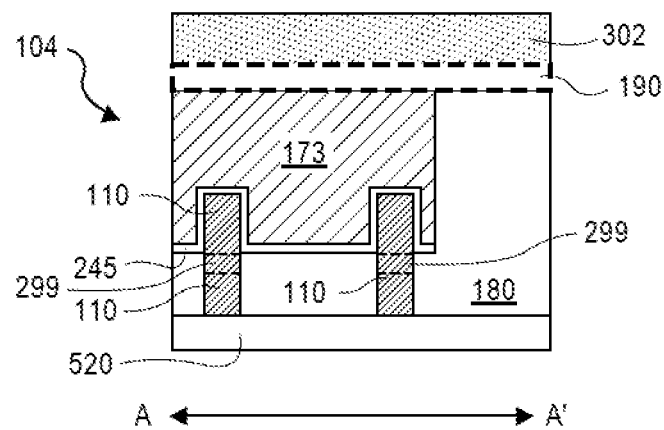
FIGS. 5A-5F illustrate cross-sectional views of a transistor cell as some operations in a method of fabricating wrap-around contact structures for semiconductor nanowires and nanoribbons are performed, in accordance with some embodiments.
Figure 5B:
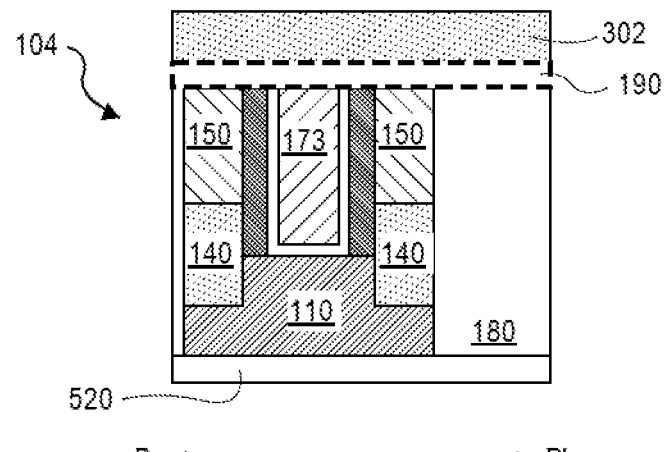
Figure 5C:
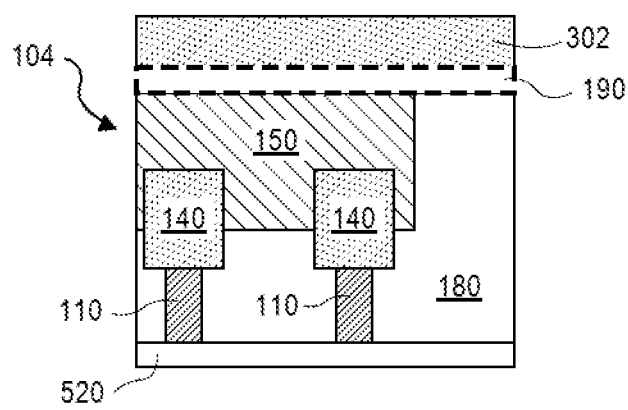

FIGS. 5A-5C depict transistor cell 104 following a deposition of back-side isolation dielectric 520 over the revealed backside of transistor semiconductor bodies 110. Back-side solation dielectric 520 is one example of a non-native material replacing a portion of an intervening layer removed to expose transistor semiconductor regions. Back-side isolation dielectric 520 may be any dielectric material suitable for electrical isolation of transistors. In some exemplary embodiments, back-side isolation dielectric 520 is silicon dioxide. Notably however, because back-side isolation dielectric 520 is deposited after back-side reveal rather than having been previously incorporated into the donor substrate, a wider selection of materials is possible than, for example, in an SOI substrate where the insulator layer is provided upstream as an embedded layer of the substrate. Hence, in some advantageous embodiments, back-side isolation dielectric 520 has a low relative permittivity (e.g., as measured for the material in a bulk state). In other words, back-side isolation dielectric may be a low-k dielectric material, such as any of those known to be suitable as a front-side ILD in a back-end interconnect stack. In some embodiments, back-side isolation dielectric 520 has a relative permittivity no greater than that of field isolation dielectric 180, and more advantageously less than that of field isolation dielectric 180. In some embodiments, back-side isolation dielectric 520 has a relative permittivity less than 3.9, and more advantageously less than 3.5. In some embodiments, back-side isolation dielectric 520 has the same composition as one or more ILD layer in front-side stack 190. Exemplary back-side isolation dielectric materials include SiOC, SiOCH, HSQ, or MSQ. Other low-k dielectrics are also possible. Likewise, other dielectric materials having a relative permittivity higher than 3.9 (e.g., SiN SiON) are also possible.

Figure 5D:
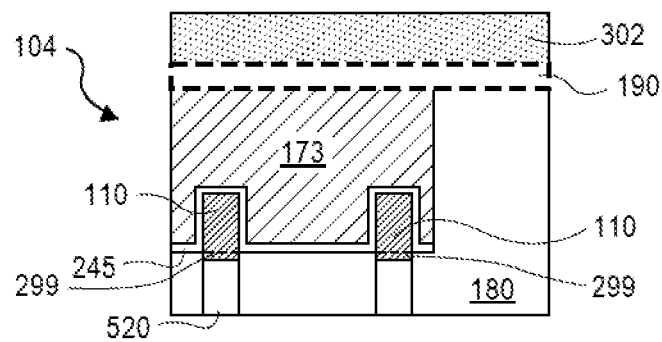
Figure 5E:
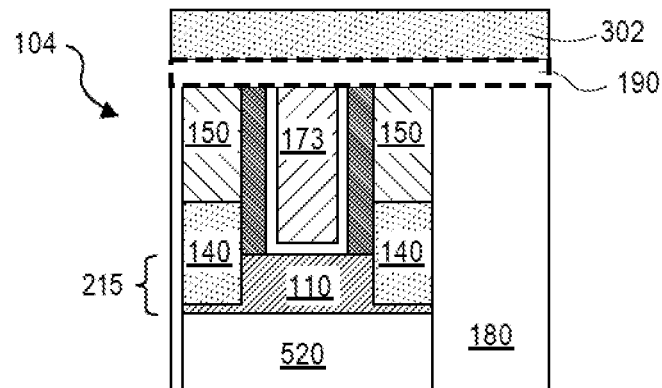
Figure 5F:
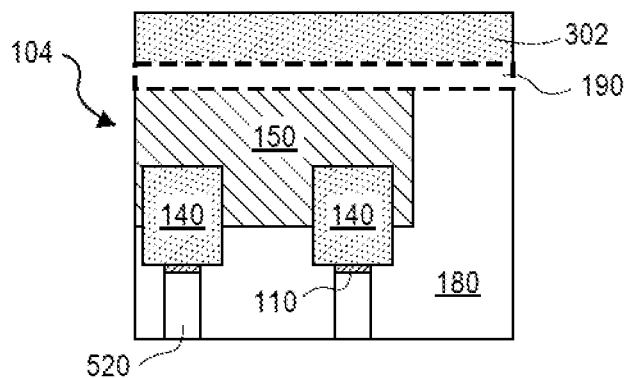

FIGS. 5D-5F depict transistor cell 104 following a replacement of at least a portion of semiconductor bodies 110 with back-side isolation dielectric 520. In some illustrative embodiments, a sub-fin portion of semiconductor bodies 110 is etched from the back side, for example with any etch process selective to the sub-fin semiconductor over field isolation 180. The back-side sub-fin recession may reveal the back side of device layer 215 (e.g., including the channel semiconductor), or not. Back-side isolation dielectric 520 is then back-filled into the resulting recesses. In alternative embodiments, a portion of an intervening layer below the device layer is converted into an isolation dielectric. For example, the sub-fin portion of semiconductor bodies 110 may be converted into back-side isolation dielectric 520. In some advantageous embodiments, at least a partial thickness of the semiconductor bodies 110 (e.g., silicon) below device layer 215 is converted to $SiO_2$ using any known thermal and/or wet chemical and/or plasma-enhanced chemical oxidation process to form back-side isolation dielectric material 520.

Figure 6A:
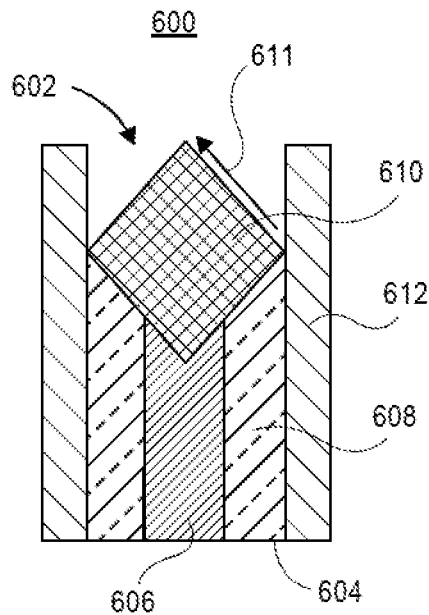
FIGS. 6A-6B illustrate cross-sectional views of various operations in a method of fabricating wrap-around contact structures for semiconductor fins, in accordance with some embodiments.
Figure 6B:
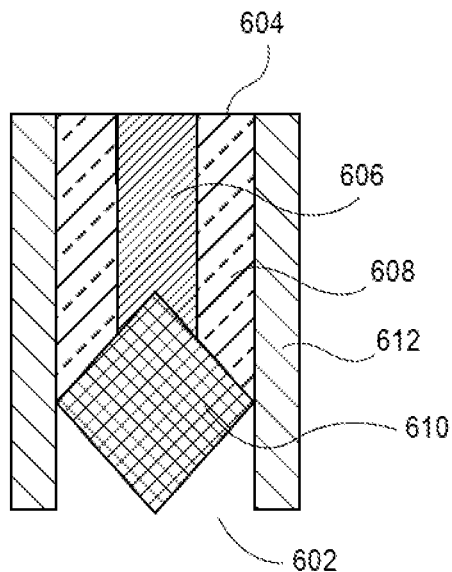

FIGS. 6A-6B illustrate cross-sectional views of various operations in a method of fabricating wrap-around contact structures for semiconductor fins, in accordance with some embodiments.

Referring to FIG. 6A, a starting structure 600 includes has a front side surface 602 and a backside surface 604. A source or drain region includes a lower fin portion 606 in an adjacent trench isolation structure 608. The source or drain region also includes an upper epitaxial portion 610. The upper epitaxial portion 610 has an exposed facet having a length 611. The source or drain region is confined between dielectric spacers 612.

Referring to FIG. 6B, the structure of FIG. 6A is turned over to expose backside surface 604 for processing. The front side 602 may be bonded to a carrier wafer in order to expose backside 604.

In another scheme showing wider features in line with, e.g., dimensions of a nanoribbon, FIGS. 7A-7F illustrate cross-sectional views of various operations in a method of fabricating wrap-around contact structures for semiconductor nanowires or nanoribbons, in accordance with some embodiments.

Figure 7A:
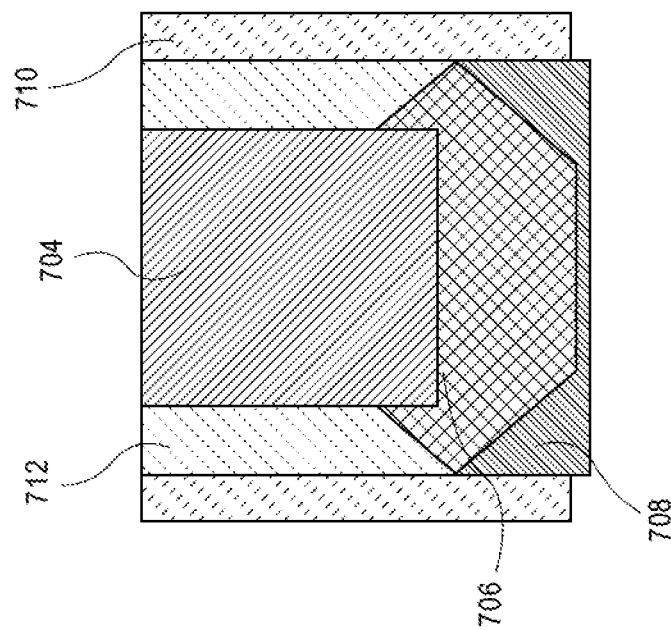
FIGS. 7A-7F illustrate cross-sectional views of various operations in a method of fabricating wrap-around contact structures for semiconductor nanowires or nanoribbons, in accordance with some embodiments.

Referring to FIG. 7A, a starting structure 700 includes a substrate portion 702 having a sub-fin portion 704 protruding therefrom. The sub-fin portion 704 may be a portion of a fin stack that is initially below a stack of alternating sacrificial layers and wire or ribbon forming layers, examples of which as described in greater detail below. An epitaxial source or drain region 706 is on the sub-fin portion 704. A first conductive contact structure 708 is over a top of the epitaxial source or drain region 706. The epitaxial source or drain region 706 is confined between dielectric spacers 710. A sacrificial material 712 is vertically between the epitaxial source or drain region 706 and the substrate portion 702, and laterally between the sub-fin portion 704 and the dielectric spacers 710.

Figure 7B:
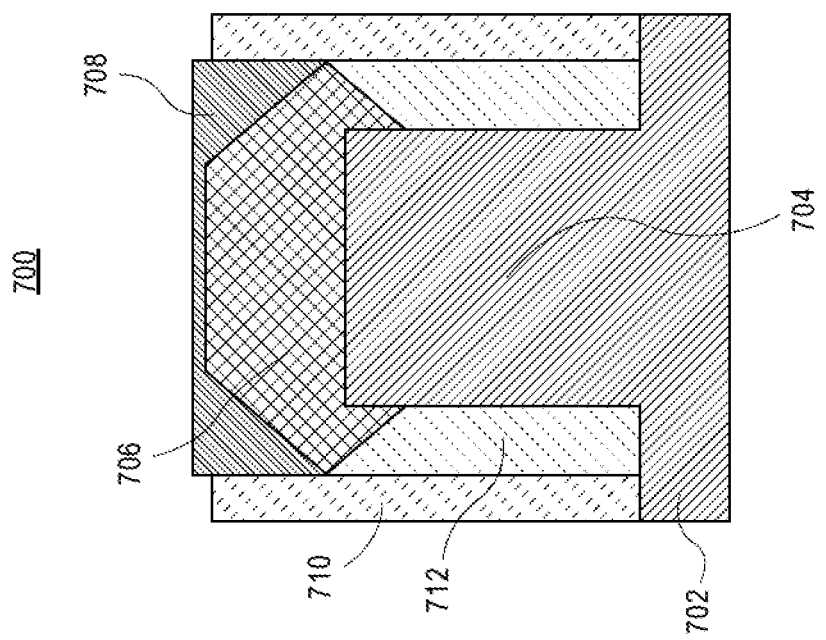

Referring to FIG. 7B, the structure of FIG. 7A is turned over to expose the substrate portion 702 for processing. The front side (e.g., side of the first conductive contact structure) may be bonded to a carrier wafer in order to expose the substrate portion 702. The substrate portion 702 is then removed.

Figure 7D:
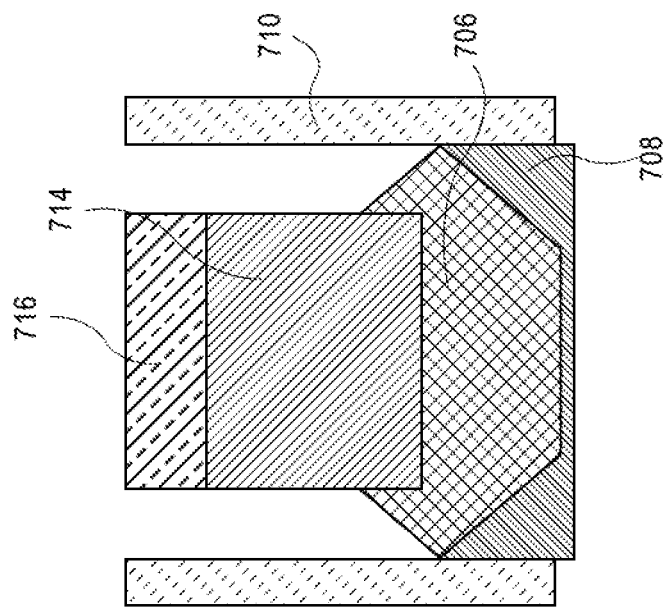
Figure 7C:
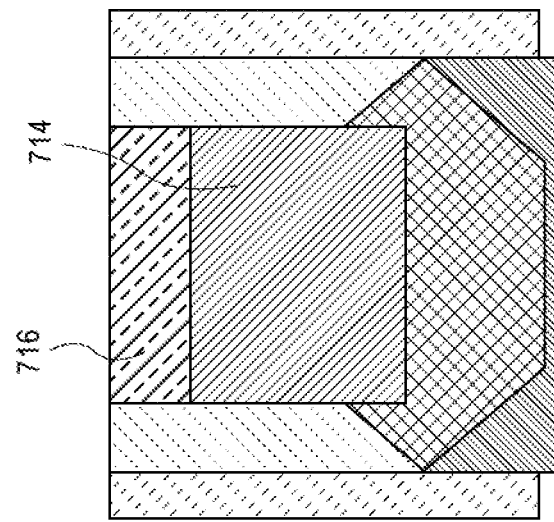

Referring to FIG. 7C, the sub-fin portion 704 is then recessed to provide recessed sub-fin portion 714 having a cavity there over. The sub-fin portion 704 may be recessed by a selective etch process to provide the recessed sub-fin portion 714. A dielectric plug 716 is then formed in the cavity, on the recessed sub-fin portion 714. The dielectric plug 716 may be formed by a blanket deposition and CMP process to fill the cavity with a dielectric material. It is to be appreciated that dielectric sidewalls may not be present or may not confine a single nanowire or nanoribbon stack (but rather confine 2 stacks, 3 stacks or more) and the approach is still applicable. In such cases, even if epitaxial regions are merged, the presence of a back-side dielectric cap on the fin may be implemented to allow for etch to enable fabrication of a wrap-around cap.

Referring to FIG. 7D, the sacrificial material 712 is then removed. In an embodiment, the sacrificial material 712 is removed by a selective etch process. It is to be appreciated that the selective etch process may not be completely selective. However, even if there is some selectivity to the 712 material, the process may be implemented, e.g., with a selectivity of 2:1 or better, where material 712 etches 2 times faster than the protection on the fin from back-side.

Figure 7F:
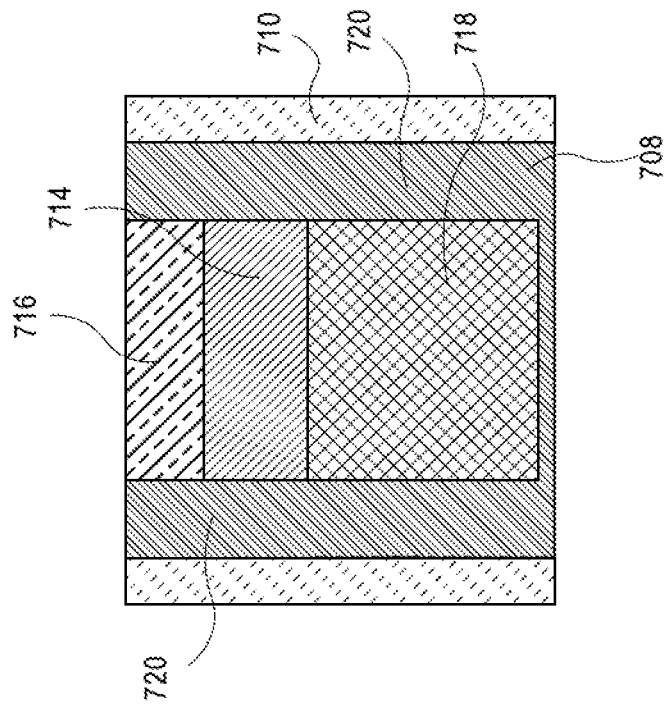
Figure 7E:
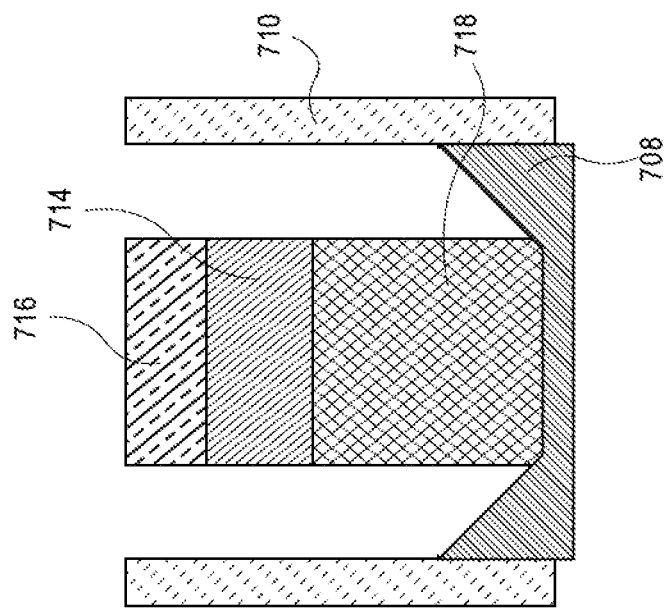

Referring to FIG. 7E, the exposed portion of the epitaxial source or drain region 706 (e.g., the portion not protected by plug 716) is then etched to form etched epitaxial portion 718. In an embodiment, the dielectric plug protects recessed sub-fin portion 714 and a central portion of epitaxial source or drain region 706 during the selective etching.

Referring to FIG. 7F, a conductive material is deposited in the openings of the structure of FIG. 7E to form a second conductive contact structure 720. Second conductive contact structure includes first conductive contact structure 708. In an embodiment, the conductive material forms second conductive contact structure 720 having a low Schottky barrier height with respect to etched epitaxial portion 718 and recessed sub-fin portion 714. It is to be appreciated that, although depicted as such, sub-fins and epitaxial source or drain regions that are wrapped with a conductive contact structure may not be absolutely vertical. For example, a dry etch can have some slope. A wrap around contact as described herein is contemplated herein as including wrap around of such non-vertical structures. It is also to be appreciated that a via for contacting to conductive contact structure 720 could be fabricated from a top (e.g., as already be in place at the time of revealing the backside), or from the bottom following a reveal process.

In an embodiment, not to be bound by theory, it is best understood that the epitaxial region 718 in-diffuses dopants to form tips. Loss of such a region early in a process flow can result in poor tip and contact doping. However, forming the contact in the manner described above may prevent any dopant loss early in the flow and allows for good tip and contact doping. Additionally, when epitaxial source or drain stressors are used to provide channel stress, the stress can mostly be maintained in this approach because the epitaxial material is not etched in-line with a channel. The result may allow for stressors to continue to exert stress on channel regions. One unique advantage is that for wires and ribbons in confined areas surrounded by isolation, the current has to go down vertically in a source or drain to reach the last wires/ribbons. With a wrap-around contact shown described herein, such a portion of the bulk resistance can be minimized by placing metal immediately next to the wires/ribbons where current is flowing.

With reference again to FIG. 7F, in accordance with one or more embodiments of the present disclosure, an integrated circuit structure includes a semiconductor nanowire above a first portion of a semiconductor sub-fin. A gate structure surrounds a channel portion of the semiconductor nanowire (it is to be appreciated that the semiconductor nanowire, the first portion of a semiconductor sub-fin and the gate structure are into the page in the perspective of FIG. 7F, with examples shown in Figures described below). A source or drain region 718 is at a first side of the gate structure. The source or drain region 718 includes an epitaxial structure on a second portion 714 of the semiconductor sub-fin. In one embodiment, the epitaxial structure has substantially vertical sidewalls in alignment with the second portion 714 of the semiconductor sub-fin. A conductive contact structure 720 is along sidewalls of the second portion 714 of the semiconductor sub-fin and along the substantially vertical sidewalls of the epitaxial structure 718.

In an embodiment, the epitaxial structure includes a flat surface distal from the second portion 714 of the semiconductor sub-fin, and the conductive contact structure 720 is further on the flat surface, as is depicted. In an alternative embodiment, the epitaxial structure includes a pair of facets that meet at a center point, such as described below in association with FIG. 8A, and the conductive contact structure is further on the pair of facets.

In an embodiment, the structure further includes a pair of dielectric spacers 710 is along sidewalls of the conductive contact structure 720, as is depicted.

In an embodiment, the structure further includes a second source or drain region at a second side of the gate structure (into the page), the second source or drain region including a second epitaxial structure on a third portion of the semiconductor sub-fin, the second epitaxial structure having substantially vertical sidewalls in alignment with the third portion of the semiconductor sub-fin. A second conductive contact structure is along sidewalls of the third portion of the semiconductor sub-fin and along the substantially vertical sidewalls of the second epitaxial structure.

In another embodiment, the structure further includes a second source or drain region at a second side of the gate structure, the second source or drain region including a second epitaxial structure on a third portion of the semiconductor sub-fin, the second epitaxial structure having non-vertical sidewalls extending laterally beyond the third portion of the semiconductor fin (e.g., such as the structure of FIG. 7B without the processing of FIGS. 7C-7F). In one such embodiment, the integrated circuit structure further includes a pair of dielectric spacers along the second epitaxial structure and the third portion of the semiconductor sub-fin. Points of the non-vertical sidewalls of the second epitaxial structure are in contact with the pair of dielectric spacers.

In an embodiment, the epitaxial structure 718 includes a semiconductor material different than the semiconductor sub-fin 714 and different than the semiconductor nanowire. In an embodiment, the gate structure includes a high-k dielectric layer, and a gate electrode including a metal. In an embodiment, the integrated circuit structure further includes a dielectric plug 716 on a surface of the second portion 714 of the semiconductor sub-fin opposite the epitaxial structure 718. In one such embodiment, the conductive contact structure 720 is further along sidewalls of the dielectric plug 716, as is depicted.

Figure 8C:
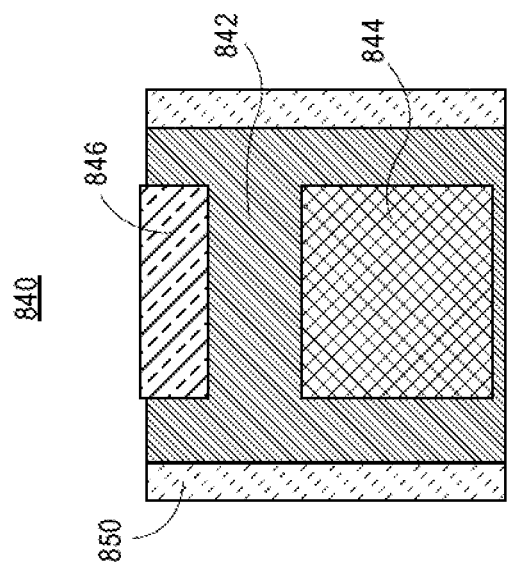
FIGS. 8A-8C illustrate cross-sectional views of various wrap-around contact structures for semiconductor nanowires or nanoribbons, in accordance with some embodiments.
Figure 8B:
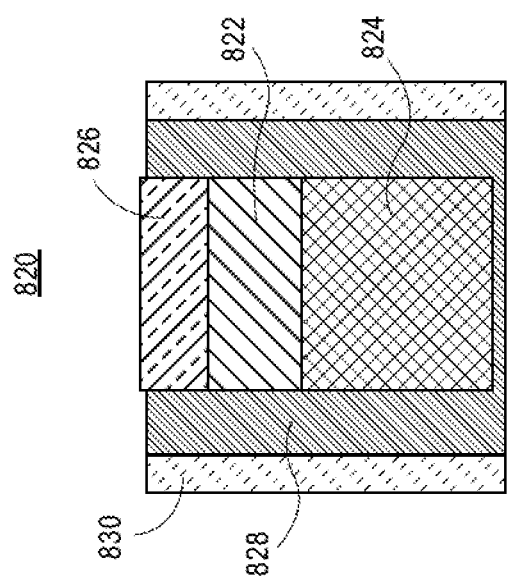
Figure 8A:
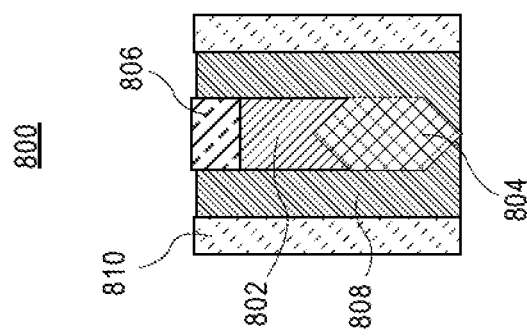

It is to be appreciated that other structures may be contemplated within the scope of embodiments described herein. As examples, FIGS. 8A-8C illustrate cross-sectional views of various wrap-around contact structures for semiconductor nanowires or nanoribbons, in accordance with some embodiments. It is to be appreciated that the structures may be suitable for a stack of one or more than one nanowires or nanoribbons.

Referring to FIG. 8A, an integrated circuit structure 800 includes a source or drain region 804. The source or drain region 804 may be an epitaxial structure on a semiconductor sub-fin portion 802. In one embodiment, the source or drain region 804 has substantially vertical sidewalls in alignment with the semiconductor sub-fin portion 802. A conductive contact structure 808 is along sidewalls of the semiconductor sub-fin portion 802 and along the substantially vertical sidewalls of the source or drain region 804. A dielectric plug 806 is on the semiconductor sub-fin portion 802. The source or drain region 804 includes a pair of facets that meet at a center point, and the conductive contact structure 808 is further on the pair of facets. Dielectric spacers 810 may be on one or both sides of the structure.

In a case fabricated from a silicon-on-insulator (SOI) substrate, referring to FIG. 8B, an integrated circuit structure 820 includes a source or drain region 824. The source or drain region 824 may be an epitaxial structure on an insulator sub-fin portion 822. In one embodiment, the source or drain region 824 has substantially vertical sidewalls in alignment with the insulator sub-fin portion 802. A conductive contact structure 828 is along sidewalls of the insulator sub-fin portion 822 and along the substantially vertical sidewalls of the source or drain region 824. A dielectric plug 826 is on the insulator sub-fin portion 822. Dielectric spacers 830 may be on one or both sides of the structure.

In a case where a sub-fin region is removed and filed with contact material, referring to FIG. 8C, an integrated circuit structure 840 includes a source or drain region 844. The source or drain region 844 may be an epitaxial structure. In one embodiment, the source or drain region 844 has substantially vertical sidewalls in alignment with the insulator sub-fin portion 802. A conductive contact structure 842 is along sidewalls of the substantially vertical sidewalls of the source or drain region 844, and is further between the source or drain region 844 and a dielectric plug 846. Dielectric spacers 850 may be on one or both sides of the structure.

It is to be appreciated that the structures resulting from the above exemplary processing schemes may be used in a same or similar form for subsequent processing operations to complete device fabrication, such as PMOS and/or NMOS device fabrication. As an example of a completed device, FIG. 9 illustrate a cross-sectional view of a non-planar integrated circuit structure as taken along a gate line, in accordance with an embodiment of the present disclosure.

Figure 9:
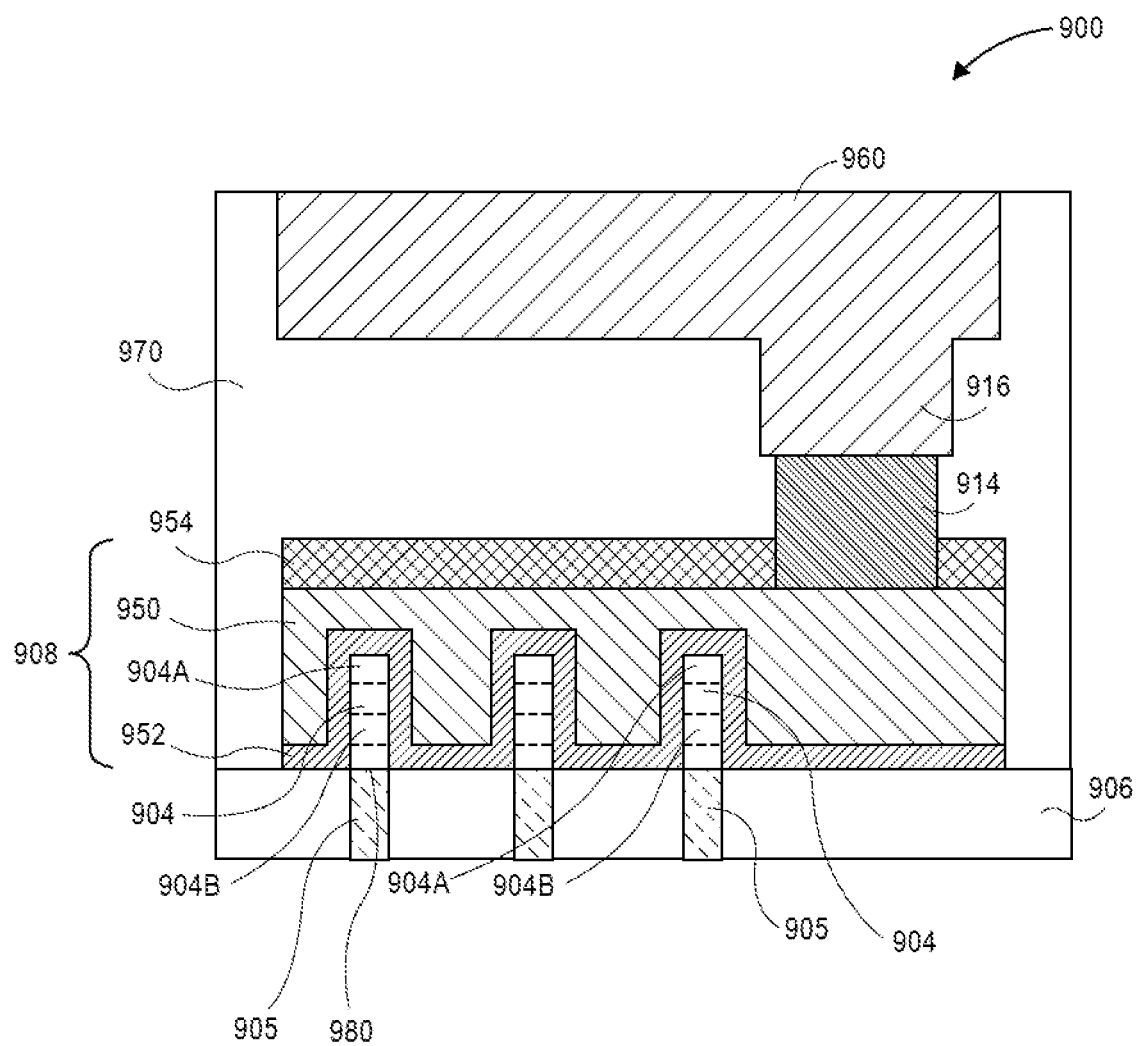
FIG. 9 illustrates a cross-sectional view of a non-planar integrated circuit structure as taken along a gate line, in accordance with an embodiment of the present disclosure.

Referring to FIG. 9, a semiconductor structure or device 900 includes a non-planar active region (e.g., a fin structure including protruding fin portion 904 and sub-fin region 905) within a trench isolation region 906. In an embodiment, instead of a solid fin, the non-planar active region is separated into nanowires (such as nanowires 904A and 904B) above sub-fin region 905, as is represented by the dashed lines. In either case, for ease of description for non-planar integrated circuit structure 900, a non-planar active region 904 is referenced below as a protruding fin portion. It is to be appreciated that a fabrication substrate, such as a bulk silicon substrate, is not depicted and, in accordance with some embodiments, may have been removed in earlier processing operations such as a backside reveal process.

A gate line 908 is disposed over the protruding portions 904 of the non-planar active region (including, if applicable, surrounding nanowires 904A and 904B), as well as over a portion of the trench isolation region 906. As shown, gate line 908 includes a gate electrode 950 and a gate dielectric layer 952. In one embodiment, gate line 908 may also include a dielectric cap layer 954. A gate contact 914, and overlying gate contact via 916 are also seen from this perspective, along with an overlying metal interconnect 960, all of which are disposed in inter-layer dielectric stacks or layers 970. Also seen from the perspective of FIG. 9, the gate contact 914 is, in one embodiment, disposed over trench isolation region 906, but not over the non-planar active regions.

In an embodiment, the semiconductor structure or device 900 is a non-planar device such as, but not limited to, a gate-all-around device, a nanowire device, a nanoribbon device, a fin-FET device, or a tri-gate device. In such an embodiment, a corresponding semiconducting channel region is composed of or is formed in a three-dimensional body. In one such embodiment, the gate electrode stacks of gate lines 908 surround at least a top surface and a pair of sidewalls of the three-dimensional body.

As is also depicted in FIG. 9, in an embodiment, an interface 980 exists between a protruding fin portion 904 and sub-fin region 905. The interface 980 can be a transition region between a doped sub-fin region 905 and a lightly or undoped upper fin portion 904. In one such embodiment, each fin is approximately 10 nanometers wide or less, and sub-fin dopants are supplied from an adjacent solid state doping layer at the sub-fin location. In a particular such embodiment, each fin is less than 10 nanometers wide.

Although not depicted in FIG. 9, it is to be appreciated that source or drain regions of or adjacent to the protruding fin portions 904 are on either side of the gate line 908, i.e., into and out of the page. In one embodiment, the source or drain regions are doped portions of original material of the protruding fin portions 904. In another embodiment, the material of the protruding fin portions 904 is removed and replaced with another semiconductor material, e.g., by epitaxial deposition to form discrete epitaxial nubs or non-discrete epitaxial structures. In either embodiment, the source or drain regions may extend below the height of dielectric layer of trench isolation region 906, i.e., into the sub-fin region 905. In accordance with an embodiment of the present disclosure, the more heavily doped sub-fin regions, i.e., the doped portions of the fins below interface 980, inhibits source to drain leakage through this portion of the bulk semiconductor fins.

With reference again to FIG. 9, in an embodiment, fins 904/905 (and, possibly nanowires 904A and 904B) are composed of a crystalline silicon, silicon/germanium or germanium layer doped with a charge carrier, such as but not limited to phosphorus, arsenic, boron or a combination thereof. In one embodiment, the concentration of silicon atoms is greater than 97%. In another embodiment, fins 904/905 are composed of a group III-V material, such as, but not limited to, gallium nitride, gallium phosphide, gallium arsenide, indium phosphide, indium antimonide, indium gallium arsenide, aluminum gallium arsenide, indium gallium phosphide, or a combination thereof. Trench isolation region 906 may be composed of a dielectric material such as, but not limited to, silicon dioxide, silicon oxy-nitride, silicon nitride, or carbon-doped silicon nitride.

Gate line 908 may be composed of a gate electrode stack which includes a gate dielectric layer 952 and a gate electrode layer 950. In an embodiment, the gate electrode of the gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the fin 904. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of a substrate or handling layer and two sidewall portions that are substantially perpendicular to the top surface of the substrate.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 914 and overlying gate contact via 916 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material).

In an embodiment (although not shown), a contact pattern which is essentially perfectly aligned to an existing gate pattern 908 is formed while eliminating the use of a lithographic step with exceedingly tight registration budget. In one such embodiment, the self-aligned approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts. In an embodiment, a fabrication process for source or drain conductive contact structures for integrated circuit structure involves use of a process scheme that ultimately provides a gate-all-around integrated circuit structure having one or more wrap-around contact structures, examples of which are described above in association with FIGS. 7A-7F and FIGS. 8A-8C.

In an embodiment, providing structure 900 involves fabrication of the gate stack structure 908 by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

Referring again to FIG. 9, the arrangement of semiconductor structure or device 900 places the gate contact over isolation regions. Such an arrangement may be viewed as inefficient use of layout space. In another embodiment, however, a semiconductor device has contact structures that contact portions of a gate electrode formed over an active region, e.g., over a fin 905, and in a same layer as a trench contact via.

It is to be appreciated that not all aspects of the processes described above need be practiced to fall within the spirit and scope of embodiments of the present disclosure. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a tri-gate device, an independently accessed double gate device, or a FIN-FET. One or more embodiments may be particularly useful for fabricating semiconductor devices at a sub-10 nanometer (10 nm) technology node.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers may be formed by CVD, PVD, or by other deposition methods.

In an embodiment, as is also used throughout the present description, lithographic operations are performed using 193 nm immersion litho (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In another aspect, one or more embodiments are directed to neighboring semiconductor structures or devices separated by self-aligned gate endcap (SAGE) structures. Particular embodiments may be directed to integration of multiple width (multi-Wsi) nanowires and nanoribbons in a SAGE architecture and separated by a SAGE wall. In an embodiment, nanowires/nanoribbons are integrated with multiple Wsi in a SAGE architecture portion of a front end process flow. Such a process flow may involve integration of nanowires and nanoribbons of different Wsi to provide robust functionality of next generation transistors with low power and high performance. Associated epitaxial source or drain regions may be embedded (e.g., portions of nanowires removed and then source or drain (S/D) growth is performed) or formed by vertical merging (e.g., epitaxial regions are formed around existing wires).

To provide further context, advantages of a self-aligned gate endcap (SAGE) architecture may include the enabling of higher layout density and, in particular, scaling of diffusion to diffusion spacing. To provide illustrative comparison, FIG. 10 illustrates cross-sectional views taken through nanowires and fins for a non-endcap architecture (left-hand side) versus a self-aligned gate endcap (SAGE) architecture (right-hand side), in accordance with an embodiment of the present disclosure.

Figure 10:
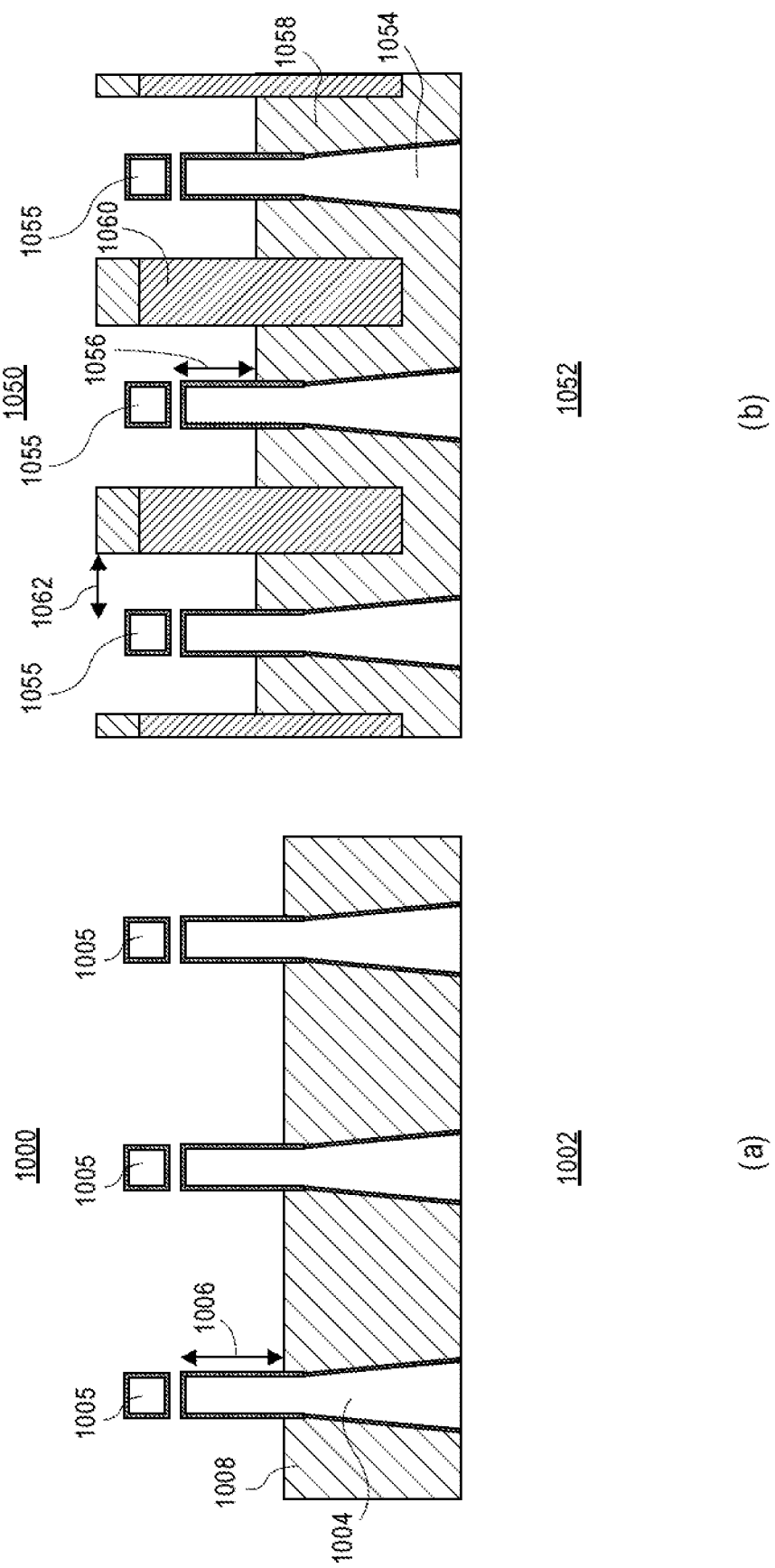
FIG. 10 illustrates cross-sectional views taken through nanowires and fins for a non-endcap architecture (left-hand side (a)) versus a self-aligned gate endcap (SAGE) architecture (right-hand side (b)), in accordance with an embodiment of the present disclosure.

Referring to the left-hand side (a) of FIG. 10, an integrated circuit structure 1000 includes a substrate (shown as location 1002 since substrate portion 1002 may ultimately be removed in a backside reveal process) having fins 1004 protruding therefrom by an amount 1006 above an isolation structure 1008 laterally surrounding lower portions of the fins 1004. Corresponding nanowires 1005 are over the fins 1004. A gate structure may be formed over the integrated circuit structure 1000 to fabricate a device. However, breaks in such a gate structure may be accommodated for by increasing the spacing between fin 1004/nanowire 1005 pairs.

By contrast, referring to the right-hand side (b) of FIG. 10, an integrated circuit structure 1050 includes a substrate (shown as location 1052 since substrate portion 1002 may ultimately be removed in a backside reveal process) having fins 1054 protruding therefrom by an amount 1056 above an isolation structure 1058 laterally surrounding lower portions of the fins 1054. Corresponding nanowires 1055 are over the fins 1054. Isolating SAGE walls 1060 (which may include a hardmask thereon, as depicted) are included within the isolation structure 1052 and between adjacent fin 1054/nanowire 1055 pairs. The distance between an isolating SAGE wall 1060 and a nearest fin 1054/nanowire 1055 pair defines the gate endcap spacing 1062. A gate structure may be formed over the integrated circuit structure 1050, between insolating SAGE walls to fabricate a device. Breaks in such a gate structure are imposed by the isolating SAGE walls. Since the isolating SAGE walls 1060 are self-aligned, restrictions from conventional approaches can be minimized to enable more aggressive diffusion to diffusion spacing. Furthermore, since gate structures include breaks at all locations, individual gate structure portions may be layer connected by local interconnects formed over the isolating SAGE walls 1060. In an embodiment, as depicted, the SAGE walls 1060 each include a lower dielectric portion and a dielectric cap on the lower dielectric portion.

In accordance with an embodiment of the present disclosure, a fabrication process for structures associated with FIG. 10 involves use of a process scheme that provides a gate-all-around integrated circuit structure having one or more wrap-around contact structures, examples of which are described above in association with FIGS. 7A-7F and FIGS. 8A-8C.

A self-aligned gate endcap (SAGE) processing scheme involves the formation of gate/trench contact endcaps self-aligned to fins without requiring an extra length to account for mask mis-registration. Thus, embodiments may be implemented to enable shrinking of transistor layout area. Embodiments described herein may involve the fabrication of gate endcap isolation structures, which may also be referred to as gate walls, isolation gate walls or self-aligned gate endcap (SAGE) walls.

Figure 11:
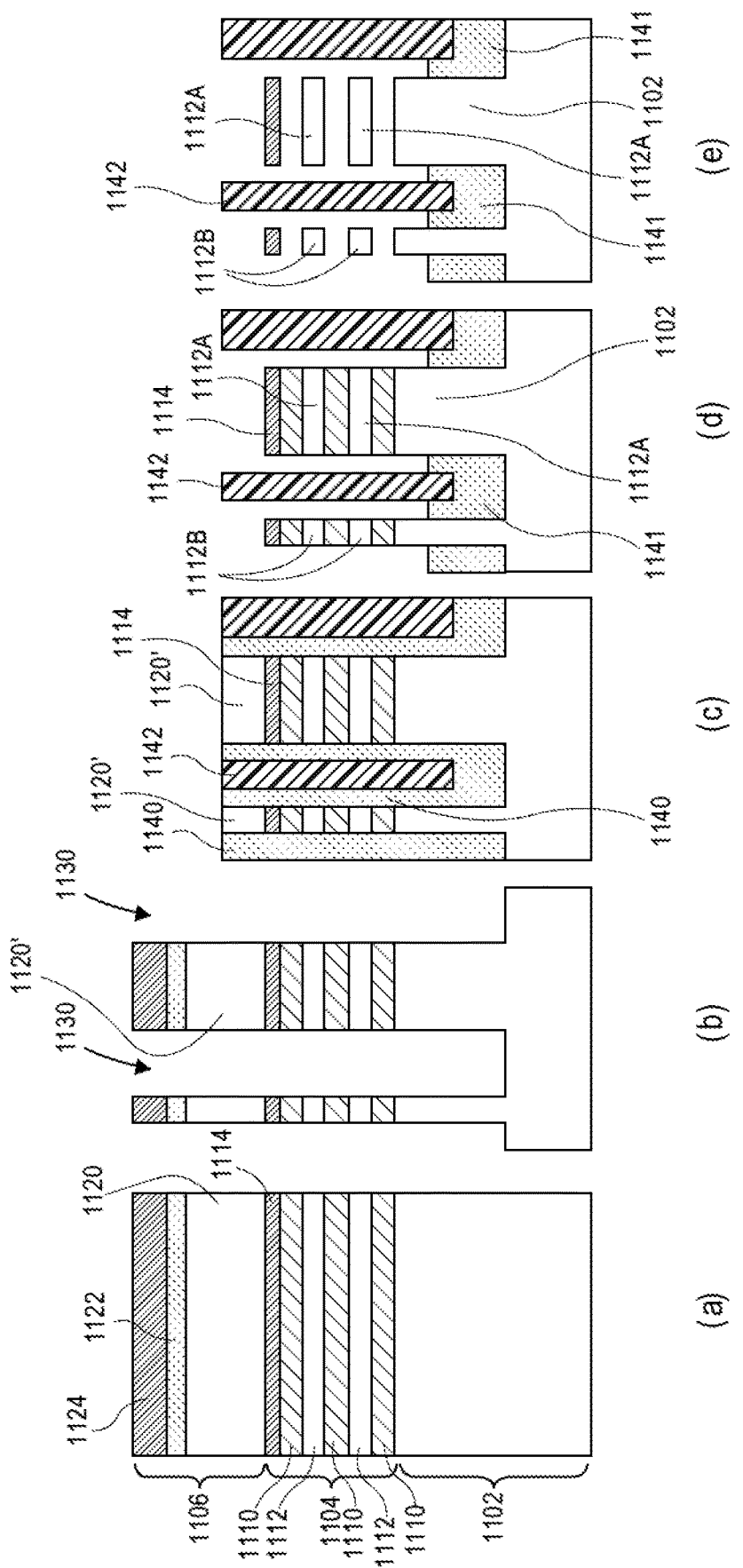
FIG. 11 illustrate cross-sectional views representing various operations in a method of fabricating a self-aligned gate endcap (SAGE) structure with gate-all-around devices, in accordance with an embodiment of the present disclosure.
Figure 13G:
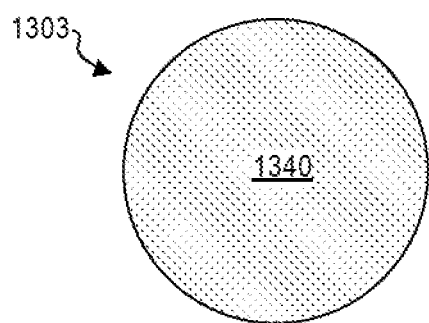
Figure 14G:
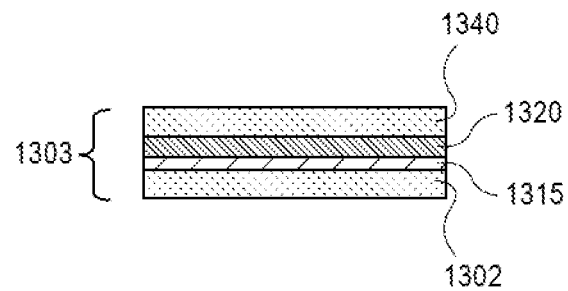
Figure 13H:
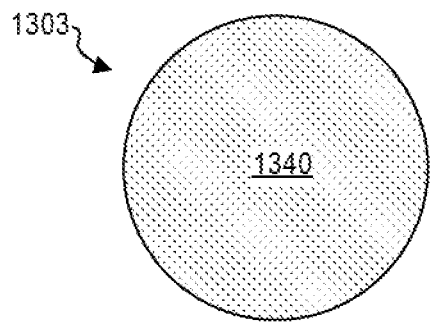
Figure 14H:
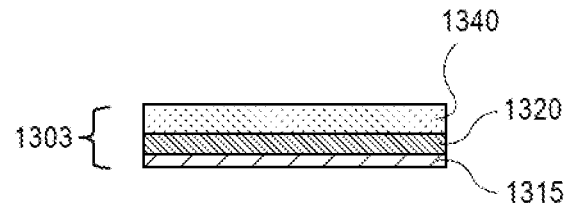

In an exemplary processing scheme for structures having SAGE walls separating neighboring devices, FIG. 11 illustrate cross-sectional views representing various operations in a method of fabricating a self-aligned gate endcap (SAGE) structure with gate-all-around devices, in accordance with an embodiment of the present disclosure.

Referring to part (a) of FIG. 11, a starting structure includes a nanowire patterning stack 1104 above a substrate 1102. A lithographic patterning stack 1106 is formed above the nanowire patterning stack 1104. The nanowire patterning stack 1104 includes alternating silicon germanium layers 1110 and silicon layers 1112. A protective mask 1114 is between the nanowire patterning stack 1104 and the lithographic patterning stack 1106. In one embodiment, the lithographic patterning stack 1106 is trilayer mask composed of a topographic masking portion 1120, an anti-reflective coating (ARC) layer 1122, and a photoresist layer 1124. In a particular such embodiment, the topographic masking portion 1120 is a carbon hardmask (CHM) layer and the anti-reflective coating layer 1122 is a silicon ARC layer.

Referring to part (b) of FIG. 11, the stack of part (a) is lithographically patterned and then etched to provide an etched structure including a patterned substrate 1102 and trenches 1130.

Referring to part (c) of FIG. 11, the structure of part (b) has an isolation layer 1140 and a SAGE material 1142 formed in trenches 1130. The structure is then planarized to leave patterned topographic masking layer 1120' as an exposed upper layer.

Referring to part (d) of FIG. 11, the isolation layer 1140 is recessed below an upper surface of the patterned substrate 1102, e.g., to define a protruding fin portion and to provide a trench isolation structure 1141 beneath SAGE walls 1142.

Referring to part (e) of FIG. 11, the silicon germanium layers 1110 are removed at least in the channel region to release silicon nanowires 1112A and 1112B. Subsequent to the formation of the structure of part (e) of FIG. 11, a gate stacks may be formed around nanowires 1112B or 1112A, over protruding fins of substrate 1102, and between SAGE walls 1142. In one embodiment, prior to formation of the gate stacks, the remaining portion of protective mask 1114 is removed. In another embodiment, the remaining portion of protective mask 1114 is retained as an insulating fin hat as an artifact of the processing scheme.

Referring again to part (e) of FIG. 11, it is to be appreciated that a channel view is depicted, with source or drain regions being locating into and out of the page. In an embodiment, the channel region including nanowires 1112B has a width less than the channel region including nanowires 1112A. Thus, in an embodiment, an integrated circuit structure includes multiple width (multi-Wsi) nanowires. Although structures of 1112B and 1112A may be differentiated as nanowires and nanoribbons, respectively, both such structures are typically referred to herein as nanowires. It is also to be appreciated that reference to or depiction of a fin/nanowire pair throughout may refer to a structure including a fin and one or more overlying nanowires (e.g., two overlying nanowires are shown in FIG. 11). In accordance with an embodiment of the present disclosure, a fabrication process for structures associated with FIG. 11 involves use of a process scheme that provides a gate-all-around integrated circuit structure having one or more wrap-around contact structures, examples of which are described above in association with FIGS. 7A-7F and FIGS. 8A-8C.

To highlight an exemplary integrated circuit structure having three vertically arranged nanowires, FIG. 12A illustrates a three-dimensional cross-sectional view of a nanowire-based integrated circuit structure, in accordance with an embodiment of the present disclosure. FIG. 12B illustrates a cross-sectional source or drain view of the nanowire-based integrated circuit structure of FIG. 12A, as taken along the a-a' axis. FIG. 12C illustrates a cross-sectional channel view of the nanowire-based integrated circuit structure of FIG. 12A, as taken along the b-b' axis.

Referring to FIG. 12A, an integrated circuit structure 1200 includes one or more vertically stacked nanowires (1204 set) above a substrate 1202. An optional fin between the bottommost nanowire and the substrate 1202 is not depicted for the sake of emphasizing the nanowire portion for illustrative purposes. Embodiments herein are targeted at both single wire devices and multiple wire devices. As an example, a three nanowire-based devices having nanowires 1204A, 1204B and 1204C is shown for illustrative purposes. For convenience of description, nanowire 1204A is used as an example where description is focused on one of the nanowires. It is to be appreciated that where attributes of one nanowire are described, embodiments based on a plurality of nanowires may have the same or essentially the same attributes for each of the nanowires.

Each of the nanowires 1204 includes a channel region 1206 in the nanowire. The channel region 1206 has a length (L). Referring to FIG. 12C, the channel region also has a perimeter (Pc) orthogonal to the length (L). Referring to both FIGS. 12A and 12C, a gate electrode stack 1208 surrounds the entire perimeter (Pc) of each of the channel regions 1206. The gate electrode stack 1208 includes a gate electrode along with a gate dielectric layer between the channel region 1206 and the gate electrode (not shown). In an embodiment, the channel region is discrete in that it is completely surrounded by the gate electrode stack 1208 without any intervening material such as underlying substrate material or overlying channel fabrication materials. Accordingly, in embodiments having a plurality of nanowires 1204, the channel regions 1206 of the nanowires are also discrete relative to one another. In accordance with an embodiment of the present disclosure, a fabrication process for structures associated with FIGS. 12A-12C involves use of a process scheme that provides a gate-all-around integrated circuit structure having one or more wrap-around contact structures, examples of which are described above in association with FIGS. 7A-7F and FIGS. 8A-8C.

Referring to both FIGS. 12A and 12B, integrated circuit structure 1200 includes a pair of non-discrete source or drain regions 1210/1212. The pair of non-discrete source or drain regions 1210/1212 is on either side of the channel regions 1206 of the plurality of vertically stacked nanowires 1204. Furthermore, the pair of non-discrete source or drain regions 1210/1212 is adjoining for the channel regions 1206 of the plurality of vertically stacked nanowires 1204. In one such embodiment, not depicted, the pair of non-discrete source or drain regions 1210/1212 is directly vertically adjoining for the channel regions 1206 in that epitaxial growth is on and between nanowire portions extending beyond the channel regions 1206, where nanowire ends are shown within the source or drain structures. In another embodiment, as depicted in FIG. 12A, the pair of non-discrete source or drain regions 1210/1212 is indirectly vertically adjoining for the channel regions 1206 in that they are formed at the ends of the nanowires and not between the nanowires.

In an embodiment, as depicted, the source or drain regions 1210/1212 are non-discrete in that there are not individual and discrete source or drain regions for each channel region 1206 of a nanowire 1204. Accordingly, in embodiments having a plurality of nanowires 1204, the source or drain regions 1210/1212 of the nanowires are global or unified source or drain regions as opposed to discrete for each nanowire. In one embodiment, from a cross-sectional perspective orthogonal to the length of the discrete channel regions 1206, each of the pair of non-discrete source or drain regions 1210/1212 is approximately rectangular in shape with a bottom tapered portion and a top vertex portion, as depicted in FIG. 12B. In other embodiments, however, the source or drain regions 1210/1212 of the nanowires are relatively larger yet discrete non-vertically merged epitaxial structures such as nubs.

In accordance with an embodiment of the present disclosure, and as depicted in FIGS. 12A and 12B, integrated circuit structure 1200 further includes a pair of contacts 1214, each contact 1214 on one of the pair of non-discrete source or drain regions 1210/1212. In one such embodiment, in a vertical sense, each contact 1214 completely surrounds the respective non-discrete source or drain region 1210/1212. In another aspect, the entire perimeter of the non-discrete source or drain regions 1210/1212 may not be accessible for contact with contacts 1214, and the contact 1214 thus only partially surrounds the non-discrete source or drain regions 1210/1212, as depicted in FIG. 12B. In a contrasting embodiment, not depicted, the entire perimeter of the non-discrete source or drain regions 1210/1212, as taken along the a-a' axis, is surrounded by the contacts 1214. In accordance with an embodiment of the present disclosure, a fabrication process for structures associated with FIGS. 12A-12C involves use of a process scheme that provides a gate-all-around integrated circuit structure having one or more wrap-around contact structures, examples of which are described above in association with FIGS. 7A-7F and FIGS. 8A-8C.

Referring to FIGS. 12B and 12C, the non-discrete source or drain regions 1210/1212 are global in the sense that a single unified feature is used as a source or drain region for a plurality (in this case, 3) of nanowires 1204 and, more particularly, for more than one discrete channel region 1206. In an embodiment, the pair of non-discrete source or drain regions 1210/1212 is composed of a semiconductor material different than the semiconductor material of the discrete channel regions 1206, e.g., the pair of non-discrete source or drain regions 1210/1212 is composed of a silicon germanium while the discrete channel regions 1206 are composed of silicon. In another embodiment, the pair of non-discrete source or drain regions 1210/1212 is composed of a semiconductor material the same or essentially the same as the semiconductor material of the discrete channel regions 1206, e.g., both the pair of non-discrete source or drain regions 1210/1212 and the discrete channel regions 1206 are composed of silicon.

Referring again to FIG. 12A, in an embodiment, integrated circuit structure 1200 further includes a pair of spacers 1216. As is depicted, outer portions of the pair of spacers 1216 may overlap portions of the non-discrete source or drain regions 1210/1212, providing for "embedded" portions of the non-discrete source or drain regions 1210/1212 beneath the pair of spacers 1216. As is also depicted, the embedded portions of the non-discrete source or drain regions 1210/1212 may not extend beneath the entirety of the pair of spacers 1216.

Substrate 1202 may be composed of a material suitable for integrated circuit structure fabrication. In one embodiment, substrate 1202 includes a lower bulk substrate composed of a single crystal of a material which may include, but is not limited to, silicon, germanium, silicon-germanium or a III-V compound semiconductor material. An upper insulator layer composed of a material which may include, but is not limited to, silicon dioxide, silicon nitride or silicon oxy-nitride is on the lower bulk substrate. Thus, the structure 1200 may be fabricated from a starting semiconductor-on-insulator substrate. Alternatively, the structure 1200 is formed directly from a bulk substrate and local oxidation is used to form electrically insulative portions in place of the above described upper insulator layer. In another alternative embodiment, the structure 1200 is formed directly from a bulk substrate and doping is used to form electrically isolated active regions, such as nanowires, thereon. In one such embodiment, the first nanowire (i.e., proximate the substrate) is in the form of an omega-FET type structure.

In an embodiment, the nanowires 1204 may be sized as wires or ribbons, as described below, and may have squared-off or rounder corners. In an embodiment, the nanowires 1204 are composed of a material such as, but not limited to, silicon, germanium, or a combination thereof. In one such embodiment, the nanowires are single-crystalline. For example, for a silicon nanowire 1204, a single-crystalline nanowire may be based from a (100) global orientation, e.g., with a <100> plane in the z-direction. As described below, other orientations may also be considered. In an embodiment, the dimensions of the nanowires 1204, from a cross-sectional perspective, are on the nano-scale. For example, in a specific embodiment, the smallest dimension of the nanowires 1204 is less than approximately 20 nanometers. In an embodiment, the nanowires 1204 are composed of a strained material, particularly in the channel regions 1206.

Referring to FIGS. 12C, in an embodiment, each of the channel regions 1206 has a width (Wc) and a height (Hc), the width (Wc) approximately the same as the height (Hc). That is, in both cases, the channel regions 1206 are square-like or, if corner-rounded, circle-like in cross-section profile. In another aspect, the width and height of the channel region need not be the same, such as the case for nanoribbons as described throughout.

In another aspect, a double-sided device processing scheme may be practiced at the wafer-level. In some exemplary embodiments, a large formal substrate (e.g., 300 or 450 mm diameter) wafer may be processed. In an exemplary processing scheme, a donor substrate including a device layer is provided. In some embodiments, the device layer is a semiconductor material that is employed by an IC device. As one example, in a transistor device, such as a field effect transistor (FET), the channel semiconductor is formed from the semiconductor device layer. As another example, for an optical device, such as a photodiode, the drift and/or gain semiconductor is formed from the device layer. The device layer may also be employed in a passive structure with an IC device. For example, an optical waveguide may employ semiconductor patterned from the device layer.

In some embodiments, the donor substrate includes a stack of material layers. Such a material stack may facilitate subsequent formation of an IC device stratum that includes the device layer but lacks other layers of the donor substrate. In an exemplary embodiment, the donor substrate includes a carrier layer separated from the device layer by one or more intervening material layers. The carrier layer is to provide mechanical support during front-side processing of the device layer. The carrier may also provide the basis for crystallinity in the semiconductor device layer. The intervening layer(s) may facilitate removal of the carrier layer and/or the reveal of the device layer backside.

Front-side fabrication operations are then performed to form a device structure that includes one or more regions in the device layer. Any known front-side processing techniques may be employed to form any known IC device and exemplary embodiments are further described elsewhere herein. A front side of the donor substrate is then joined to a host substrate to form a device-host assembly. The host substrate is to provide front-side mechanical support during back-side processing of the device layer. The host substrate may also entail integrated circuitry with which the IC devices fabricated on the donor substrate are interconnected. For such embodiments, joining of the host and donor substrate may further entail formation of 3D interconnect structures through hybrid (dielectric/metal) bonding. Any known host substrate and wafer-level joining techniques may be employed.

The process flow continues where the back side of the device stratum is revealed by removing at least a portion of the carrier layer. In some further embodiments, portions of any intervening layer and/or front-side materials deposited over the device layer may also be removed during the reveal operation. As described elsewhere herein in the context of some exemplary embodiments, an intervening layer(s) may facilitate a highly-uniform exposure of the device stratum back-side, for example serving as one or more of an etch marker or etch stop employed in the wafer-level backside reveal process. Device stratum surfaces exposed from the back side are processed to form a double-side device stratum. Native materials, such as any of those of the donor substrate, which interfaced with the device regions may then be replaced with one or more non-native materials. For example, a portion of a semiconductor device layer or intervening layer may be replaced with one or more other semiconductor, metal, or dielectric materials. In some further embodiments, portions of the front-side materials removed during the reveal operation may also be replaced. For example, a portion of a dielectric spacer, gate stack, or contact metallization formed during front-side device fabrication may be replaced with one or more other semiconductor, metal, or dielectric materials during backside deprocessing/reprocessing of the front-side device. In still other embodiments, a second device stratum or metal interposer is bonded to the reveal back-side.

The above process flow provides a device stratum-host substrate assembly. The device stratum-host assembly may then be further processed. For example, any known technique may be employed to singulate and package the device stratum-host substrate assembly. Where the host substrate is entirely sacrificial, packaging of the device stratum-host substrate may entail separation of the host substrate from the device stratum. Where the host substrate is not entirely sacrificial (e.g., where the host substrate also includes a device stratum), the device stratum-host assembly output may be fed back as a host substrate input during a subsequent iteration of the above process flow. Iteration of the above approach may thus form a wafer-level assembly of any number of double-side device strata, each only tens or hundreds of nanometers in thickness, for example. In some embodiments, and as further described elsewhere herein, one or more device cells within a device stratum are electrically tested, for example as a yield control point in the fabrication of a wafer-level assembly of double-side device strata. In some embodiments, the electrical test entails back-side device probing.

FIGS. 13A-13H illustrate plan views of a substrate processed with double-sided device processing methods, in accordance with some embodiments. FIGS. 14A-14H illustrate cross-sectional views of a substrate processed with double-sided device processing methods, in accordance with some embodiments.

As shown in FIGS. 13A and 14A, donor substrate 1301 includes a plurality of IC die 1311 in an arbitrary spatial layout over a front-side wafer surface. Front-side processing of IC die 1311 may have been performed following any techniques to form any device structures. In exemplary embodiments, die 1311 include one or more semiconductor regions within device layer 1315. An intervening layer 1310 separates device layer 1315 from carrier layer 1305. In the exemplary embodiment, intervening layer 1310 is in direct contact with both carrier layer 1305 and device layer 1315. Alternatively, one or more spacer layers may be disposed between intervening layer 1310 and device layer 1315 and/or carrier layer 1305. Donor substrate 1301 may further include other layers, for example disposed over device layer 1315 and/or below carrier layer 1305.

Device layer 1315 may include one or more layers of any device material composition known to be suitable for a particular IC device, such as, but not limited to, transistors, diodes, and resistors. In some exemplary embodiments, device layer 1315 includes one or more group IV (i.e., IUPAC group 14) semiconductor material layers (e.g., Si, Ge, SiGe), group III-V semiconductor material layers (e.g., GaAs, InGaAs, InAs, InP), or group III-N semiconductor material layers (e.g., GaN, AlGaN, InGaN). Device layer 1315 may also include one or more semiconductor transition metal dichalcogenide (TMD or TMDC) layers. In other embodiments, device layer 1315 includes one or more graphene layer, or a graphenic material layer having semiconductor properties. In still other embodiments, device layer 1315 includes one or more oxide semiconductor layers. Exemplary oxide semiconductors include oxides of a transition metal (e.g., IUPAC group 4-10) or post-transition metal (e.g., IUPAC groups 11-14). In advantageous embodiments, the oxide semiconductor includes at least one of Cu, Zn, Sn, Ti, Ni, Ga, In, Sr, Cr, Co, V, or Mo. The metal oxides may be suboxides ($A_2O$) monoxides (AO), binary oxides ($AO_2$), ternary oxides ($ABO_3$), and mixtures thereof. In other embodiments, device layer 1315 includes one or more magnetic, ferromagnetic, ferroelectric material layer. For example device layer 1315 may include one or more layers of any material known to be suitable for an tunneling junction device, such as, but not limited to a magnetic tunneling junction (MTJ) device.

In some embodiments, device layer 1315 is substantially monocrystalline. Although monocrystalline, a significant number of crystalline defects may nonetheless be present. In other embodiments, device layer 1315 is amorphous or nanocrystalline. Device layer 1315 may be any thickness (e.g., z-dimension in FIG. 14A). In some exemplary embodiments, device layer 1315 has a thickness greater than a z-thickness of at least some of the semiconductor regions employed by die 1311 as functional semiconductor regions of die 1311 built on and/or embedded within device layer 1315 need not extend through the entire thickness of device layer 1315. In some embodiments, semiconductor regions of die 1311 are disposed only within a top-side thickness of device layer 1315 demarked in FIG. 14A by dashed line 1312. For example, semiconductor regions of die 1311 may have a z-thickness of 200-300 nm, or less, while device layer may have a z-thickness of 700-1000 nm, or more. As such, around 600 nm of device layer thickness may separate semiconductor regions of die 1311 from intervening layer 1310.

Carrier layer 1305 may have the same material composition as device layer 1315, or may have a material composition different than device layer 1315. For embodiments where carrier layer 1305 and device layer 1315 have the same composition, the two layers may be identified by their position relative to intervening layer 1310. In some embodiments where device layer 1315 is a crystalline group IV, group III-V or group III-N semiconductor, carrier layer 1305 is the same crystalline group IV, group III-V or group III-N semiconductor as device layer 1315. In alternative embodiments, where device layer 1315 is a crystalline group IV, group III-V or group III-N semiconductor, carrier layer 1305 is a different crystalline group IV, group III-V or group III-N semiconductor than device layer 1315. In still other embodiments, carrier layer 1305 may include, or be, a material onto which device layer 1315 transferred, or grown upon. For example, carrier layer may include one or more amorphous oxide layers (e.g., glass) or crystalline oxide layer (e.g., sapphire), polymer sheets, or any material(s) built up or laminated into a structural support known to be suitable as a carrier during IC device processing. Carrier layer 1305 may be any thickness (e.g., z-dimension in FIG. 14A) as a function of the carrier material properties and the substrate diameter. For example, where the carrier layer 1305 is a large format (e.g., 300-450 mm) semiconductor substrate, the carrier layer thickness may be 700-1000 μm, or more.

In some embodiments, one or more intervening layers 1310 are disposed between carrier layer 1305 and device layer 1315. In some exemplary embodiments, an intervening layer 1310 is compositionally distinct from carrier layer 1305 such that it may serve as a marker detectable during subsequent removal of carrier layer 1305. In some such embodiments, an intervening layer 1310 has a composition that, when exposed to an etchant of carrier layer 1305 will etch at a significantly slower rate than carrier layer 1305 (i.e., intervening layer 1310 functions as an etch stop for a carrier layer etch process). In further embodiments, intervening layer 1310 has a composition distinct from that of device layer 1315. Intervening layer 1310 may be a metal, semiconductor, or dielectric material, for example.

In some exemplary embodiments where at least one of carrier layer 1305 and device layer 1315 are crystalline semiconductors, intervening layer 1310 is also a crystalline semiconductor layer. Intervening layer 1310 may further have the same crystallinity and crystallographic orientation as carrier layer 1305 and/or device layer 1315. Such embodiments may have the advantage of reduced donor substrate cost relative to alternative embodiments where intervening layer 1310 is a material that necessitates bonding (e.g., thermal-compression bonding) of intervening layer 1310 to device layer 1315 and/or to carrier layer 1305.

For embodiments where intervening layer 1310 is a semiconductor, one or more of the primary semiconductor lattice elements, alloy constituents, or impurity concentrations may vary between at least carrier layer 1305 and intervening layer 1310. In some embodiments where at least carrier layer 1305 is a group IV semiconductor, intervening layer 1310 may also be a group IV semiconductor, but of a different group IV element or alloy and/or doped with an impurity species to an impurity level different than that of carrier layer 1305. For example, intervening layer 1310 may be a silicon-germanium alloy epitaxially grown on a silicon carrier. For such embodiments, a pseudomorphic intervening layer may be grown heteroepitaxially to any thickness below the critical thickness. Alternatively, the intervening layer 1310 may be a relaxed buffer layer having a thickness greater than the critical thickness.

In other embodiments, where at least carrier layer 1305 is a group III-V semiconductor, intervening layer 1310 may also be a group III-V semiconductor, but of a different group III-V alloy and/or doped with an impurity species to an impurity level different than that of carrier layer 1305. For example, intervening layer 1310 may be an AlGaAs alloy epitaxially grown on a GaAs carrier. In some other embodiments where both carrier layer 1305 and device layer 1315 are crystalline semiconductors, intervening layer 1310 is also a crystalline semiconductor layer, which may further have the same crystallinity and crystallographic orientation as carrier layer 1305 and/or device layer 1315.

In embodiments where both carrier layer 1305 and intervening layer 1310 are of the same or different primary semiconductor lattice elements, impurity dopants may differentiate the carrier and intervening layer. For example, intervening layer 1310 and carrier layer 1305 may both be silicon crystals with intervening layer 1310 lacking an impurity present in carrier layer 1305, or doped with an impurity absent from carrier layer 1305, or doped to a different level with an impurity present in carrier layer 1305. The impurity differentiation may impart etch selectivity between the carrier and intervening layer, or merely introduce a detectable species.

Intervening layer 1310 may be doped with impurities that are electrically active (i.e., rendering it an n-type or p-type semiconductor), or not, as the impurity may provide any basis for detection of the intervening layer 1310 during subsequent carrier removal. Exemplary electrically active impurities for some semiconductor materials include group III elements (e.g., B), group IV elements (e.g., P). Any other element may be employed as a non-electrically active species. Impurity dopant concentration within intervening layer 1310 need only vary from that of carrier layer 1305 by an amount sufficient for detection, which may be predetermined as a function of the detection technique and detector sensitivity.

As described further elsewhere herein, intervening layer 1310 may have a composition distinct from device layer 1315. In some such embodiments, intervening layer 1310 may have a different band gap than that of device layer 1315. For example, intervening layer 1310 may have a wider band-gap than device layer 1315.

In embodiments where intervening layer 1310 includes a dielectric material, the dielectric material may be an inorganic material (e.g., SiO, SiN, SiON, SiOC, hydrogen silsesquioxane, methyl silsesquioxane) or organic material (polyimide, polynorbornenes, benzocyclobutene). For some dielectric embodiments, intervening layer 1310 may be formed as an embedded layer (e.g., SiOx through implantation of oxygen into a silicon device and/or carrier layer). Other embodiments of a dielectric intervening layer may necessitate bonding (e.g., thermal-compression bonding) of carrier layer 1305 to device layer 1315. For example, where donor substrate 1301 is a semiconductor-on-oxide (SOI) substrate, either or both of carrier layer 1305 and device layer 1315 may be oxidized and bonded together to form a SiO intervening layer 1310. Similar bonding techniques may be employed for other inorganic or organic dielectric materials.

In some other embodiments, intervening layer 1310 includes two or more materials laterally spaced apart within the layer. The two or more materials may include a dielectric and a semiconductor, a dielectric and a metal, a semiconductor and a metal, a dielectric and a metal, two different dielectric, two different semiconductors, or two different metals. Within such an intervening layer, a first material may surround islands of the second material that extend through the thickness of the intervening layer. For example, an intervening layer may include a field isolation dielectric that surrounds islands of semiconductor, which extend through the thickness of the intervening layer. The semiconductor may be epitaxially grown within openings of a patterned dielectric or the dielectric material may be deposited within openings of a patterned semiconductor.

In some exemplary embodiments, semiconductor features, such as fins or mesas or nanowires or nanoribbons, are formed into or above a front-side surface of a semiconductor device layer. Trenches surrounding these features may be subsequently backfilled with an isolation dielectric, for example following any known shallow trench isolation (STI) process. One or more of the semiconductor feature or isolation dielectric may be employed for terminating a back-side carrier removal process, for example as a back-side reveal etch stop. In some embodiments, a reveal of trench isolation dielectric may stop, significantly retard, or induce a detectable signal for terminating a back-side carrier polish. For example, a CMP polish of carrier semiconductor employing a slurry that has high selectivity favoring removal of carrier semiconductor (e.g., Si) over removal of isolation dielectric (e.g., SiO) may be significantly slowed upon exposure of a (bottom) surface of the trench isolation dielectric surrounding semiconductor features including the device layer. Because the device layer is disposed on a front side of intervening layer, the device layer need not be directly exposed to the back-side reveal process.

Notably, for embodiments where the intervening layer includes both semiconductor and dielectric, the intervening layer thickness may be considerably greater than the critical thickness associated with the lattice mismatch of the intervening layer and carrier. Whereas an intervening layer below critical thickness may be an insufficient thickness to accommodate non-uniformity of a wafer-level back-side reveal process, embodiments with greater thickness may advantageously increase the back-side reveal process window. Embodiments with pin-holed dielectric may otherwise facilitate subsequent separation of carrier and device layers as well as improve crystal quality within the device layer.

Semiconductor material within intervening layers that include both semiconductor and dielectric may also be homoepitaxial. In some exemplary embodiments, a silicon epitaxial device layer is grown through a pin-holed dielectric disposed over a silicon carrier layer.

Continuing with description of FIGS. 13A and 14A, intervening layer 1310 may also be a metal. For such embodiments, the metal may be of any composition known to be suitable for bonding to carrier layer 1305 or device layer 1315. For example, either or both of carrier layer 1305 and device layer 1315 may be finished with a metal, such as, but not limited to Au or Pt, and subsequently bonded together, for example to form an Au or Pt intervening layer 1310. Such a metal may also be part of an intervening layer that further includes a patterned dielectric surrounding metal features.

Intervening layer 1310 may be of any thickness (e.g., z-height in FIG. 14A). The intervening layer should be sufficiently thick to ensure the carrier removal operation can be reliably terminated before exposing device regions and/or device layer 1315. Exemplary thicknesses for intervening layer 1310 range from a few hundred nanometers to a few micrometers and may vary as a function of the amount of carrier material that is to be removed, the uniformity of the carrier removal process, and the selectivity of the carrier removal process, for example. For embodiments where the intervening layer has the same crystallinity and crystallographic orientation as carrier layer 1305, the carrier layer thickness may be reduced by the thickness of intervening layer 1310. In other words, intervening layer 1310 may be a top portion of a 700-1000 μm thick group IV crystalline semiconductor substrate also employed as the carrier layer. In pseudomorphic heteroepitaxial embodiments, intervening layer thickness may be limited to the critical thickness. For heteroepitaxial intervening layer embodiments employing aspect ratio trapping (ART) or another fully relaxed buffer architecture, the intervening layer may have any thickness.

As further illustrated in FIGS. 13B and 14B, donor substrate 1301 may be joined to a host substrate 1302 to form a donor-host substrate assembly 1303. In some exemplary embodiments, a front-side surface of donor substrate 1301 is joined to a surface of host substrate 1302 such that device layer 1315 is proximal host substrate 1302 and carrier layer 1305 is distal from host substrate 1302. Host substrate 1302 may be any substrate known to be suitable for joining to device layer 1315 and/or a front-side stack fabricated over device layer 1315. In some embodiments, host substrate 1302 includes one or more additional device strata. For example, host substrate 1302 may further include one or more device layer (not depicted). Host substrate 1302 may include integrated circuitry with which the IC devices fabricated in a device layer of host substrate 1302 are interconnected, in which case joining of device layer 1315 to host substrate 1302 may further entail formation of 3D interconnect structures through the wafer-level bond.

Although not depicted in detail by FIG. 14B, any number of front-side layers, such as interconnect metallization levels and interlayer dielectric (ILD) layers, may be present between device layer 1315 and host substrate 1302. Any technique may be employed to join host substrate 1302 and donor substrate 1301. In some exemplary embodiments further described elsewhere herein, the joining of donor substrate 1301 to host substrate 1302 is through metal-metal, oxide-oxide, or hybrid (metal/oxide-metal/oxide) thermal compression bonding.

With host substrate 1302 facing device layer 1315 on a side opposite carrier layer 1305, at least a portion of carrier layer 1305 may be removed as further illustrated in FIGS. 13C and 14C. Where the entire carrier layer 1305 is removed, donor-host substrate assembly 1303 maintains a highly uniform thickness with planar back side and front side surfaces. Alternatively, carrier layer 1305 may be masked and intervening layer 1310 exposed only in unmasked sub-regions to form a non-planar back side surface. In the exemplary embodiments illustrated by FIGS. 13C and 14C, carrier layer 1305 is removed from the entire back-side surface of donor-host substrate assembly 1303. Carrier layer 1305 may be removed, for example by cleaving, grinding, and/or polishing (e.g., chemical-mechanical polishing), and/or wet chemical etching, and/or plasma etching through a thickness of the carrier layer to expose intervening layer 1310. One or more operations may be employed to remove carrier layer 1305. Advantageously, the removal operation(s) may be terminated based on duration or an endpoint signal sensitive to exposure of intervening layer 1310.

In further embodiments, for example as illustrated by FIGS. 13D and 14D, intervening layer 1310 is also at least partially etched to expose a back side of device layer 1315. At least a portion of intervening layer 1310 may be removed subsequent to its use as a carrier layer etch stop and/or carrier layer etch endpoint trigger. Where the entire intervening layer 1310 is removed, donor-host substrate assembly 1303 maintains a highly uniform device layer thickness with planar back-side and front-side surfaces afforded by the intervening layer being much thinner than the carrier layer. Alternatively, intervening layer 1310 may be masked and device layer 1315 exposed only in unmasked sub-regions, thereby forming a non-planar back-side surface. In the exemplary embodiments illustrated by FIGS. 13D and 14D, intervening layer 1310 is removed from the entire back-side surface of donor-host substrate assembly 1303. Intervening layer 1310 may be so removed, for example, by polishing (e.g., chemical-mechanical polishing), and/or blanket wet chemical etching, and/or blanket plasma etching through a thickness of the intervening layer to expose device layer 1315. One or more operations may be employed to remove intervening layer 1310. Advantageously, the removal operation(s) may be terminated based on duration or an endpoint signal sensitive to exposure of device layer 1315.

In some further embodiments, for example as illustrated by FIGS. 13E and 14E, device layer 1315 is partially etched to expose a back side of a device structure previously formed from during front-side processing. At least a portion of device layer 1315 may be removed subsequent to its use in fabricating one or more of the device semiconductor regions, and/or its use as an intervening layer etch stop or endpoint trigger. Where device layer 1315 is thinned over the entire substrate area, donor-host substrate assembly 1303 maintains a highly uniform reduced thickness with planar back and front surfaces. Alternatively, device layer 1315 may be masked and device structures (e.g., device semiconductor regions) selectively revealed only in unmasked sub-regions, thereby forming a non-planar back-side surface. In the exemplary embodiments illustrated by FIGS. 13E and 14E, device layer 1315 is thinned over the entire back-side surface of donor-host substrate assembly 1303. Device layer 1315 may be thinned, for example by polishing (e.g., chemical-mechanical polishing), and/or wet chemical etching, and/or plasma etching through a thickness of the device layer to expose one or more device semiconductor regions, and/or one or more other device structures (e.g., front-side device terminal contact metallization, spacer dielectric, etc.) previously formed during front-side processing. One or more operations may be employed to thin device layer 1315. Advantageously, the device layer thinning may be terminated based on duration or an endpoint signal sensitive to exposure of patterned features within device layer 1315. For example, where front-side processing forms device isolation features (e.g., shallow trench isolation), back-side thinning of device layer 1315 may be terminated upon exposing the isolation dielectric material.

A non-native material layer may be deposited over a back-side surface of an intervening layer, device layer, and/or specific device regions within device layer 1315, and/or over or more other device structures (e.g., front-side device terminal contact metallization, spacer dielectric, etc.). One or more materials exposed (revealed) from the backside may be covered with non-native material layer or replaced with such a material. In some embodiments, illustrated by FIGS. 13F and 14F, non-native material layer 1320 is deposited on device layer 1315. Non-native material layer 1320 may be any material having a composition and/or microstructure distinct from that of the material removed to reveal the backside of the device stratum. For example, where intervening layer 1310 is removed to expose device layer 1315, non-native material layer 1320 may be another semiconductor of different composition or microstructure than that of intervening layer 1310. In some such embodiments where device layer 1315 is a III-N semiconductor, non-native material layer 1320 may also be a III-N semiconductor of the same or different composition that is regrown upon a revealed backside surface of a III-N device region. This material may be epitaxially regrown from the revealed III-N device region, for example, to have better crystal quality than that of the material removed, and/or to induce strain within the device layer and/or device regions within the device layer, and/or to form a vertical (e.g., z-dimension) stack of device semiconductor regions suitable for a stacked device.

In some other embodiments where device layer 1315 is a III-V semiconductor, non-native material layer 1320 may also be a III-V semiconductor of the same or different composition that is regrown upon a revealed backside surface of a III-V device region. This material may be epitaxially regrown from the revealed III-V device region, for example, to have relatively better crystal quality than that of the material removed, and/or to induce strain within the device layer or a specific device region within the device layer, and/or to form a vertical stack of device semiconductor regions suitable for a stacked device.

In some other embodiments where device layer 1315 is a group IV semiconductor, non-native material layer 1320 may also be a group IV semiconductor of the same or different composition that is regrown upon a revealed backside surface of a group IV device region. This material may be epitaxially regrown from the revealed group IV device region, for example, to have relatively better crystal quality than that of the material removed, and/or to induce strain within the device region, and/or to form a stack of device semiconductor regions suitable for a stacked device.

In some other embodiments, non-native material layer 1320 is a dielectric material, such as, but not limited to SiO, SiON, SiOC, hydrogen silsesquioxane, methyl silsesquioxane, polyimide, polynorbornenes, benzocyclobutene, or the like. Deposition of such a dielectric may serve to electrically isolate various device structures, such as semiconductor device regions, that may have been previously formed during front-side processing of donor substrate 1301.

In some other embodiments, non-native material layer 1320 is a conductive material, such as any elemental metal or metal alloy known to be suitable for contacting one or more surfaces of device regions revealed from the backside. In some embodiments, non-native material layer 1320 is a metallization suitable for contacting a device region revealed from the backside, such as a transistor source or drain region.

In some embodiments, non-native material layer 1320 is a stack of materials, such as a FET gate stack that includes both a gate dielectric layer and a gate electrode layer. As one example, non-native material layer 1320 may be a gate dielectric stack suitable for contacting a semiconductor device region revealed from the backside, such as a transistor channel region. Any of the other the materials described as options for device layer 1315 may also be deposited over a backside of device layer 1315 and/or over device regions formed within device layer 1315. For example, non-native material layer 1320 may be any of the oxide semiconductors, TMDC, or tunneling materials described above, which may be deposited on the back-side, for example, to incrementally fabricate vertically-stacked device strata.

Back-side wafer-level processing may continue in any manner known to be suitable for front-side processing. For example, non-native material layer 1320 may be patterned into active device regions, device isolation regions, device contact metallization, or device interconnects using any known lithographic and etch techniques. Back-side wafer-level processing may further fabricate one or more interconnect metallization levels coupling terminals of different devices into an IC. In some embodiments further described elsewhere herein, back-side processing may be employed to interconnect a power bus to various device terminals within an IC.

In some embodiments, back-side processing includes bonding to a secondary host substrate. Such bonding may employ any layer transfer process to join the back-side (e.g., non-native) material layer to another substrate. Following such joining, the former host substrate may be removed as a sacrificial donor to re-expose the front-side stack and/or the front side of the device layer. Such embodiments may enable iterative side-to-side lamination of device strata with a first device layer serving as the core of the assembly. In some embodiments illustrated in FIGS. 13G and 14G, secondary host substrate 1340 joined to non-native material layer 1320 provides at least mechanical support while host substrate 1302 is removed.

Any bonding, such as, but not limited to, thermal-compression bonding may be employed to join secondary host substrate 1340 to non-native material layer 1320. In some embodiments, both a surface layer of secondary host substrate 1340 and non-native material layer 1320 are continuous dielectric layers (e.g., SiO), which are thermal-compression bonded. In some other embodiments, both a surface layer of secondary host substrate 1340 and non-native material layer 1320 include a metal layer (e.g., Au, Pt, etc.), which are thermal-compression bonded. In other embodiments, at least one of surface layer of secondary host substrate 1340 and non-native material layer 1320 are patterned, including both patterned metal surface (i.e., traces) and surrounding dielectric (e.g., isolation), which are thermal-compression bonded to form a hybrid (e.g., metal/oxide) joint. For such embodiments, structural features in the secondary host substrate 1340 and the patterned non-native material layer 1320 are aligned (e.g., optically) during the bonding process. In some embodiments, non-native material layer 1320 includes one or more conductive back-side traces coupled to a terminal of a transistor fabricated in device layer 1315. The conductive back-side trace may, for example, be bonded to metallization on secondary host substrate 1340.

Bonding of device strata may proceed from the front-side and/or back-side of a device layer before or after front-side processing of the device layer has been completed. A back-side bonding process may be performed after front-side fabrication of a device (e.g., transistor) is substantially complete. Alternatively, back-side bonding process may be performed prior to completing front-side fabrication of a device (e.g., transistor), in which case the front side of the device layer may receive additional processing following the back-side bonding process. As further illustrated in FIGS. 13H and 14H, for example, front-side processing includes removal of host substrate 1302 (as a second donor substrate) to re-expose the front side of device layer 1315. At this point, donor-host substrate assembly 1303 includes secondary host 1340 joined to device layer 1315 through non-native material 1320.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 15:
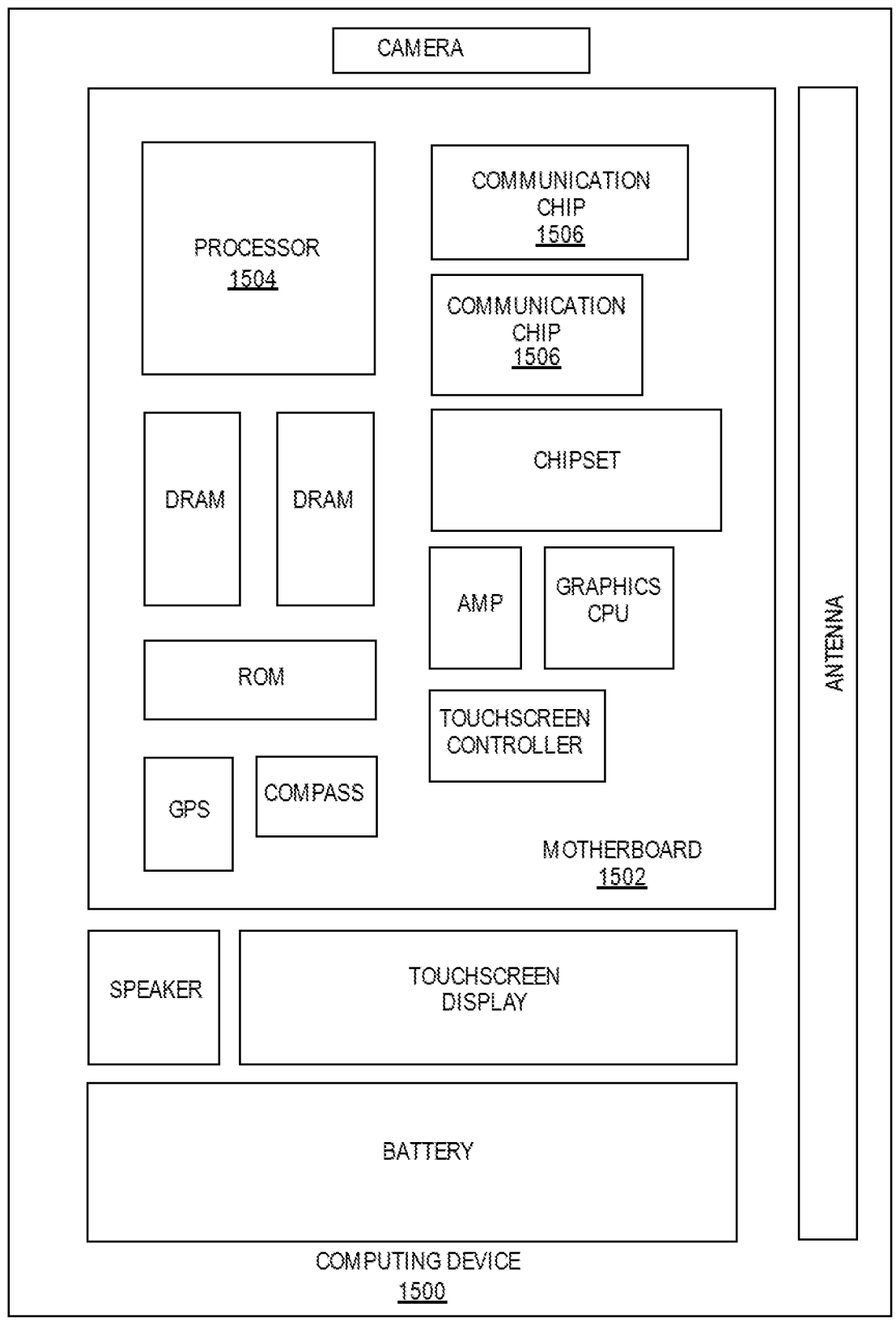
FIG. 15 illustrates a computing device in accordance with one implementation of an embodiment of the present disclosure.

FIG. 15 illustrates a computing device 1500 in accordance with one implementation of an embodiment of the present disclosure. The computing device 1500 houses a board 1502. The board 1502 may include a number of components, including but not limited to a processor 1504 and at least one communication chip 1506. The processor 1504 is physically and electrically coupled to the board 1502. In some implementations the at least one communication chip 1506 is also physically and electrically coupled to the board 1502. In further implementations, the communication chip 1506 is part of the processor 1504.

Depending on its applications, computing device 1500 may include other components that may or may not be physically and electrically coupled to the board 1502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1506 enables wireless communications for the transfer of data to and from the computing device 1500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1500 may include a plurality of communication chips 1506. For instance, a first communication chip 1506 may be dedicated to shorter range wireless communications such as Wi-Fi and Bluetooth and a second communication chip 1506 may be dedicated to longer range wireless communications such as GPS, EDGE, GPRS, CDMA, WiMAX, LTE, Ev-DO, and others.

The processor 1504 of the computing device 1500 includes an integrated circuit die packaged within the processor 1504. The integrated circuit die of the processor 1504 may include one or more structures, such as wrap-around contact structures for semiconductor nanowires and nanoribbons, built in accordance with implementations of embodiments of the present disclosure. The term "processor" may refer to any device or portion of a device that processes electronic data from registers and/or memory to transform that electronic data into other electronic data that may be stored in registers and/or memory.

The communication chip 1506 also includes an integrated circuit die packaged within the communication chip 1506. The integrated circuit die of the communication chip 1506 may include one or more structures, such as wrap-around contact structures for semiconductor nanowires and nanoribbons, built in accordance with implementations of embodiments of the present disclosure.

In further implementations, another component housed within the computing device 1500 may contain an integrated circuit die that includes one or structures, such as wrap-around contact structures for semiconductor nanowires and nanoribbons, built in accordance with implementations of embodiments of the present disclosure.

In various implementations, the computing device 1500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1500 may be any other electronic device that processes data.

Figure 16:
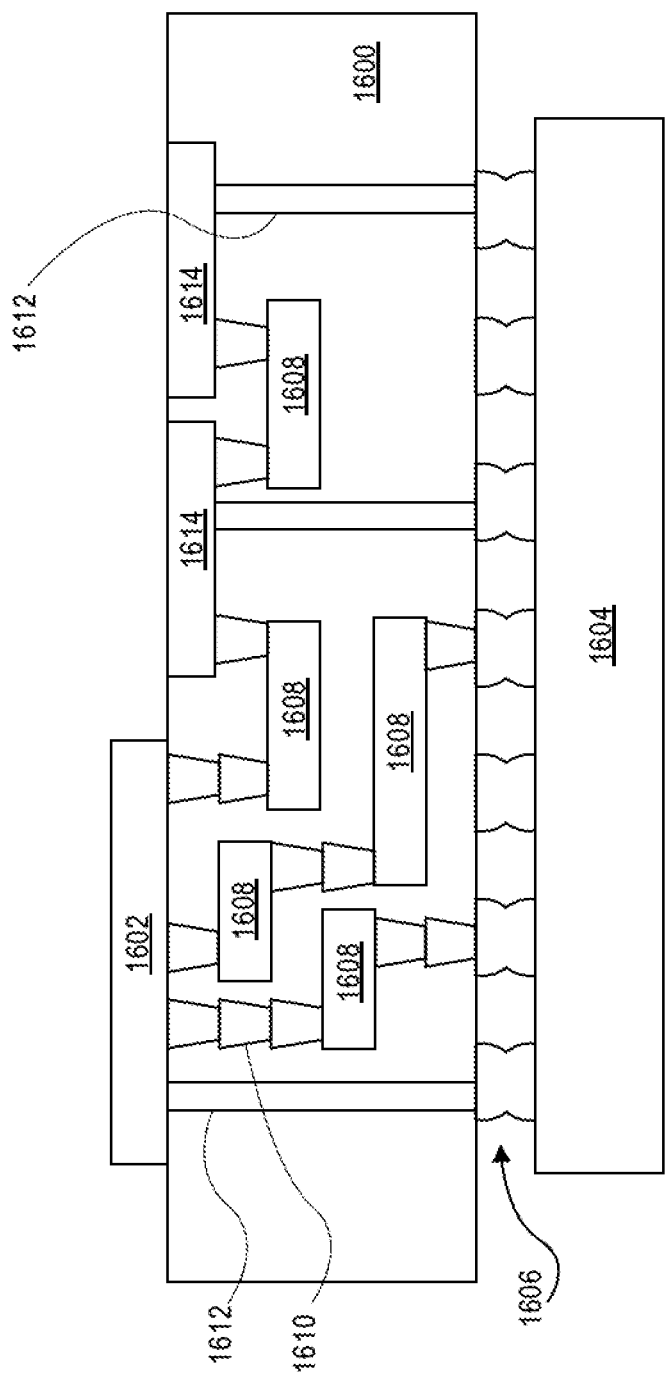
FIG. 16 illustrates an interposer that includes one or more embodiments of the present disclosure.

FIG. 16 illustrates an interposer 1600 that includes one or more embodiments of the present disclosure. The interposer 1600 is an intervening substrate used to bridge a first substrate 1602 to a second substrate 1604. The first substrate 1602 may be, for instance, an integrated circuit die. The second substrate 1604 may be, for instance, a memory module, a computer motherboard, or another integrated circuit die. Generally, the purpose of an interposer 1600 is to spread a connection to a wider pitch or to reroute a connection to a different connection. For example, an interposer 1600 may couple an integrated circuit die to a ball grid array (BGA) 1606 that can subsequently be coupled to the second substrate 1604. In some embodiments, the first and second substrates 1602/1604 are attached to opposing sides of the interposer 1600. In other embodiments, the first and second substrates 1602/1604 are attached to the same side of the interposer 1600. And in further embodiments, three or more substrates are interconnected by way of the interposer 1600.

The interposer 1600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1608 and vias 1610, including but not limited to through-silicon vias (TSVs) 1612. The interposer 1600 may further include embedded devices 1614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1600. In accordance with embodiments of the disclosure, apparatuses or processes disclosed herein may be used in the fabrication of interposer 1600 or in the fabrication of components included in the interposer 1600.

Thus, embodiments of the present disclosure include wrap-around contact structures for semiconductor nanowires and nanoribbons, and methods of fabricating wrap-around contact structures for semiconductor nanowires and nanoribbons.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a semiconductor nanowire above a first portion of a semiconductor sub-fin. A gate structure surrounds a channel portion of the semiconductor nanowire. A source or drain region is at a first side of the gate structure, the source or drain region including an epitaxial structure on a second portion of the semiconductor sub-fin, the epitaxial structure having substantially vertical sidewalls in alignment with the second portion of the semiconductor sub-fin. A conductive contact structure is along sidewalls of the second portion of the semiconductor sub-fin and along the substantially vertical sidewalls of the epitaxial structure.

Example embodiment 2: The integrated circuit structure of example embodiment 1, wherein the epitaxial structure includes a flat surface distal from the second portion of the semiconductor sub-fin, and wherein the conductive contact structure is further on the flat surface.

Example embodiment 3: The integrated circuit structure of example embodiment 1, wherein the epitaxial structure includes a pair of facets that meet at a center point, and wherein the conductive contact structure is further on the pair of facets.

Example embodiment 4: The integrated circuit structure of example embodiment 1, 2 or 3, further including a pair of dielectric spacers along sidewalls of the conductive contact structure.

Example embodiment 5: The integrated circuit structure of example embodiment 1, 2, 3 or 4, further including a second source or drain region at a second side of the gate structure, the second source or drain region including a second epitaxial structure on a third portion of the semiconductor sub-fin, the second epitaxial structure having substantially vertical sidewalls in alignment with the third portion of the semiconductor sub-fin. A second conductive contact structure is along sidewalls of the third portion of the semiconductor sub-fin and along the substantially vertical sidewalls of the second epitaxial structure.

Example embodiment 6: The integrated circuit structure of example embodiment 1, 2, 3 or 4, further including a second source or drain region at a second side of the gate structure, the second source or drain region including a second epitaxial structure on a third portion of the semiconductor sub-fin, the second epitaxial structure having non-vertical sidewalls extending laterally beyond the third portion of the semiconductor fin.

Example embodiment 7: The integrated circuit structure of example embodiment 6, further including a pair of dielectric spacers along the second epitaxial structure and the third portion of the semiconductor sub-fin, wherein points of the non-vertical sidewalls of the second epitaxial structure are in contact with the pair of dielectric spacers.

Example embodiment 8: The integrated circuit structure of example embodiment 1, 2, 3, 4, 5, 6 or 7, wherein the epitaxial structure includes a semiconductor material different than the semiconductor sub-fin and different than the semiconductor nanowire.

Example embodiment 9: The integrated circuit structure of example embodiment 1, 2, 3, 4, 5, 6, 7 or 8, wherein the gate structure includes a high-k dielectric layer, and a gate electrode including a metal.

Example embodiment 10: The integrated circuit structure of example embodiment 1, 2, 3, 4, 5, 6, 7, 8 or 9, further including a dielectric plug on a surface of the second portion of the semiconductor sub-fin opposite the epitaxial structure.

Example embodiment 11: The integrated circuit structure of example embodiment 10, wherein the conductive contact structure is further along sidewalls of the dielectric plug.

Example embodiment 12: An integrated circuit structure includes a semiconductor nanowire above a first portion of a semiconductor sub-fin. A gate structure surrounds a channel portion of the semiconductor nanowire. A source or drain region is at a first side of the gate structure, the source or drain region including a second portion of the semiconductor sub-fin on a dielectric plug. A conductive contact structure is along sidewalls of the second portion of the semiconductor sub-fin and along sidewalls of the dielectric plug. A pair of dielectric spacers is along sidewalls of the conductive contact structure.

Example embodiment 13: The integrated circuit structure of example embodiment 12, further including a second source or drain region at a second side of the gate structure, the second source or drain region including a third portion of the semiconductor sub-fin on a second dielectric plug. A second conductive contact structure is along sidewalls of the third portion of the semiconductor sub-fin and along sidewalls of the second dielectric plug.

Example embodiment 14: The integrated circuit structure of example embodiment 12 or, wherein the gate structure includes a high-k dielectric layer, and a gate electrode including a metal.

Example embodiment 15: A method of fabricating an integrated circuit structure includes forming a semiconductor nanowire above a first portion of a semiconductor sub-fin. The method also includes forming a gate structure surrounding a channel portion of the semiconductor nanowire. The method also includes forming a source or drain region at a first side of the gate structure, the source or drain region including an epitaxial structure on a second portion of the semiconductor sub-fin, the epitaxial structure having substantially vertical sidewalls in alignment with the second portion of the semiconductor sub-fin. The method also includes forming a conductive contact structure along sidewalls of the second portion of the semiconductor sub-fin and along the substantially vertical sidewalls of the epitaxial structure.

Example embodiment 16: The method of example embodiment 15, further including forming a pair of dielectric spacers along sidewalls of the conductive contact structure.

Example embodiment 17: The method of example embodiment 15 or 16, further including forming a second source or drain region at a second side of the gate structure, the second source or drain region including a second epitaxial structure on a third portion of the semiconductor sub-fin, the second epitaxial structure having substantially vertical sidewalls in alignment with the third portion of the semiconductor sub-fin. The method also further includes forming a second conductive contact structure along sidewalls of the third portion of the semiconductor sub-fin and along the substantially vertical sidewalls of the second epitaxial structure.

Example embodiment 18: The method of example embodiment 15 or 16, further including forming a second source or drain region at a second side of the gate structure, the second source or drain region including a second epitaxial structure on a third portion of the semiconductor sub-fin, the second epitaxial structure having non-vertical sidewalls extending laterally beyond the third portion of the semiconductor sub-fin.

Example embodiment 19: The method of example embodiment 18, further including forming a pair of dielectric spacers along the second epitaxial structure and the third portion of the semiconductor sub-fin, wherein points of the non-vertical sidewalls of the second epitaxial structure are in contact with the pair of dielectric spacers.

Example embodiment 20: The method of example embodiment 15, 16, 17, 18 or 19, wherein the epitaxial structure includes a semiconductor material different than the semiconductor sub-fin and different than the semiconductor nanowire.

Example embodiment 21: The method of example embodiment 15, 16, 17, 18, 19 or 20, wherein the gate structure includes a high-k dielectric layer, and a gate electrode including a metal.

Example embodiment 22: The method of example embodiment 15, 16, 17, 18, 19, 20 or 21, further including forming a dielectric plug on a surface of the second portion of the semiconductor sub-fin opposite the epitaxial structure.

Example embodiment 23: The method of example embodiment 22, wherein the conductive contact structure is further formed along sidewalls of the dielectric plug.

What is claimed is:

1. An integrated circuit structure, comprising:
   a semiconductor nanowire above a semiconductor sub-fin, the semiconductor sub-fin having a first lateral width;
   a gate structure surrounding a channel portion of the semiconductor nanowire, and the gate structure above the semiconductor sub-fin;
   a source or drain region at a first side of the gate structure, the source or drain region comprising an epitaxial structure, the epitaxial structure having substantially vertical sidewalls, and the epitaxial structure having a second lateral width, the second lateral width substantially the same as the first lateral width; and
   a conductive contact structure along a bottom, along a top, and along the substantially vertical sidewalls of the epitaxial structure, wherein a portion of the conductive contact structure along the bottom of the epitaxial structure is laterally adjacent to the semiconductor sub-fin.

2. The integrated circuit structure of claim 1, wherein the top of the epitaxial structure comprises a flat surface.

3. The integrated circuit structure of claim 1, wherein the top of the epitaxial structure comprises a pair of facets that meet at a center point.

4. The integrated circuit structure of claim 1, further comprising:
   a pair of dielectric spacers along sidewalls of the conductive contact structure.

5. The integrated circuit structure of claim 1, further comprising:
   a second source or drain region at a second side of the gate structure, the second source or drain region comprising a second epitaxial structure having substantially vertical sidewalls; and
   a second conductive contact structure along a bottom, along a top, and along the substantially vertical sidewalls of the second epitaxial structure, wherein a portion of the second conductive contact structure along the bottom of the epitaxial structure is laterally spaced apart from the semiconductor sub-fin.

6. The integrated circuit structure of claim 1, further comprising:
   a second source or drain region at a second side of the gate structure, the second source or drain region comprising a second epitaxial structure having non-vertical sidewalls.

7. The integrated circuit structure of claim 6, further comprising:
   a pair of dielectric spacers along the second epitaxial structure, wherein points of the non-vertical sidewalls of the second epitaxial structure are in contact with the pair of dielectric spacers.

8. The integrated circuit structure of claim 1, wherein the epitaxial structure comprises a semiconductor material different than the semiconductor sub-fin and different than the semiconductor nanowire.

9. The integrated circuit structure of claim 1, wherein the gate structure comprises a high-k dielectric layer, and a gate electrode comprising a metal.

10. The integrated circuit structure of claim 1, further comprising:
    a dielectric plug on a surface of the conductive contact structure opposite the epitaxial structure.

11. The integrated circuit structure of claim 10, wherein the conductive contact structure is further along sidewalls of the dielectric plug.

12. A computing device, comprising:
a board; and
a component coupled to the board, the component including an integrated circuit structure, comprising:
- a semiconductor nanowire above a semiconductor sub-fin, the semiconductor sub-fin having a first lateral width;
- a gate structure surrounding a channel portion of the semiconductor nanowire, and the gate structure above the semiconductor sub-fin;
- a source or drain region at a first side of the gate structure, the source or drain region comprising an epitaxial structure, the epitaxial structure having substantially vertical sidewalls, and the epitaxial structure having a second lateral width, the second lateral width substantially the same as the first lateral width; and
- a conductive contact structure along a bottom, along a top, and along the substantially vertical sidewalls of the epitaxial structure, wherein a portion of the conductive contact structure along the bottom of the epitaxial structure is laterally adjacent to the semiconductor sub-fin.

13. The computing device of claim 12, further comprising:
a memory coupled to the board.

14. The computing device of claim 12, further comprising:
a communication chip coupled to the board.

15. The computing device of claim 12, further comprising:
a battery coupled to the board.

16. The computing device of claim 12, further comprising:
a camera coupled to the board.

17. The computing device of claim 12, further comprising:
a GPS coupled to the board.

18. The computing device of claim 12, further comprising:
a compass coupled to the board.

19. The computing device of claim 12, wherein the component is a packaged integrated circuit die.

20. The computing device of claim 12, wherein the component is selected from the group consisting of a processor, a communications chip, and a digital signal processor.

* * * * *